United States Patent
Kumagai et al.

(10) Patent No.: US 6,507,124 B2
(45) Date of Patent: *Jan. 14, 2003

(54) SEMICONDUCTOR MEMORY DEVICE

(75) Inventors: Takashi Kumagai, Suwa (JP); Masahiro Takeuchi, Suwa (JP); Satoru Kodaira, Suwa (JP); Takafumi Noda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/876,068

(22) Filed: Jun. 8, 2001

(65) Prior Publication Data
US 2002/0024856 A1 Feb. 28, 2002

(30) Foreign Application Priority Data
Jun. 15, 2000 (JP) .......................... 2000-179978

(51) Int. Cl.[7] ............................................... H01L 27/11
(52) U.S. Cl. .................... 257/903; 257/904; 365/154
(58) Field of Search .................................. 257/903, 904

(56) References Cited
U.S. PATENT DOCUMENTS 5,909,047 A * 6/1999 Takahashi ................... 257/351
6,005,296 A * 12/1999 Chan .......................... 257/368
6,246,605 B1 * 6/2001 Ishida et al. ................. 365/154
6,347,048 B2 * 2/2002 Kumagai et al. ............ 257/368

FOREIGN PATENT DOCUMENTS
JP 10-41409 A 2/1998

OTHER PUBLICATIONS
IEDM Technical Digest 1998 by M. Ishida et al.
U.S. patent application Ser. No. 09/876,058, Kumagai et al., filed Jun. 08, 2001.
U.S. patent application Ser. No. 09/876,059, Kumagai et al., filed Jun. 08, 2001.
U.S. patent application Ser. No. 09/876,056, Kumagai et al., filed Jun. 08, 2001.

* cited by examiner

Primary Examiner—David Nelms
Assistant Examiner—Long Tran
(74) Attorney, Agent, or Firm—Oliff & Berridge, PLC

(57) ABSTRACT

The invention provides SRAMs that can reduce memory cells in size and correct light proximity effect. Gate electrode layers in a first layer, drain-drain connection layers in a second layer, and drain-gate connection layers in a third layer define connection wirings of a flip-flop. A $p^+$ type well contact region is provided for every two of the memory cells arranged in the Y-axis direction.

8 Claims, 17 Drawing Sheets

SEMICONDUCTOR MEMORY DEVICE

BACKGROUND OF THE INVENTION

1. Field of Invention

The present invention relates to semiconductor memory devices such as SRAMs (static random access memories).

2. Description of Related Art

SRAMs, one type of semiconductor memory devices, do not require a refreshing operation, and therefore have characteristics that can simplify a system in which they are incorporated and facilitate lower power consumption. For this reason, the SRAMs are prevailingly used as memories for hand-carry type equipment, such as cellular phones.

It is preferable for the hand-carry type equipment to be reduced in size. Therefore, the memory size of the SRAMs must be reduced.

SUMMARY OF THE INVENTION

It is an object of the present invention to provide a semiconductor memory device that can reduce the size of memory cells.

In accordance with the present invention, a semiconductor memory device includes: a memory cell including a first driver transistor of a first conduction type, a second driver transistor of a first conduction type, a first load transistor of a second conduction type, a second load transistor of a second conduction type, a first transfer transistor of a first conduction type and a second transfer transistor of a first conduction type; a well contact region of a first conduction type; and a well contact region of a second conduction type. The memory cell, the well contact region of the first conduction type, and the well contact region of the second conduction type are provided in a plurality, respectively. The memory cell is equipped with first and second gate electrode layers, first and second drain-drain connection layers, and first and second drain-gate connection layers. The first gate electrode layer includes gate electrodes of the first driver transistor and the first load transistor. The second gate electrode layer includes gate electrodes of the second driver transistor and the second load transistor. The first drain-drain connection layer connects a drain region of the first driver transistor and a drain region of the first load transistor. The second drain-drain connection layer connects a drain region of the second driver transistor and a drain region of the second load transistor. The first drain-gate connection layer connects the first drain-drain connection layer and the second gate electrode layer. The second drain-gate connection layer connects the second drain-drain connection layer and the first gate electrode layer. The drain-gate connection layers, the drain-drain connection layers, and the gate electrode layers are provided in different layers, respectively, in plan view. The first and second gate electrode layers are located between the first drain-drain connection layer and the second drain-drain connection layer. The well contact region of the first conduction type is provided for each specified number of memory cells arranged in a first direction. The well contact region of the second conduction type is provided for every two of memory cells arranged in a second direction, which is perpendicular to the first direction.

The present invention is equipped with gate electrode layers that become gates of inverters, drain-drain connection layers that connect drains of the inverters, and drain-gate connection layers that connect gates of one of the inverters and drains of the other of the inverters. In accordance with the present invention, three layers (gate electrode layers, drain-drain connection layers, and drain-gate connection layers) are used to form flip-flops. Accordingly, patterns in each layer can be simplified (for example, into linear patterns) compared to the case in which flip-flops are formed using two layers. In this manner, in accordance with the present invention, since the patterns in each layer can be simplified, a miniaturized semiconductor memory device with its memory cell size being 4.5 $\mu m^2$ or smaller, for example, can be manufactured.

Also, in accordance with the present invention, in plan view, the first and second gate electrode layers are located between the first drain-drain connection layer and the second drain-drain connection layer. As a result, the source contact layer of the driver transistors can be disposed in the central area of the memory cell. Furthermore, wirings that connect the source contact layers to the grounding line can be disposed in the same layer as the drain-drain connection layers and in the center of the memory cell. Accordingly, the degree of freedom in forming the first and second drain-gate connection layers increases. This also facilitates reducing memory cell size. It is noted that, in the present invention, the source contact layer is a conduction layer that is used to connect a source region of the driver transistor to a wiring layer.

Also, in accordance with the present invention, latch-up is prevented. In other words, in a semiconductor memory device in accordance with the present invention, a well contact region can be disposed in a second conduction type well in which driver transistors and transfer transistors are formed for every two memory cells arranged in the second direction. Generally, when the transistors are operated and drain current flows, substrate current (current from an end of the drain to the well contact region) flows. In particular, the driver transistors have the largest substrate current. An increase in the potential that is the product of the substrate current and the substrate resistance (well resistance) causes latch-up. In the structure described above, a well contact region is formed in the memory cell, such that the driver transistor having a large substrate current is located close to the well contact region. As a result, the substrate resistance can be reduced, and therefore the generation of latch-up can be prevented.

Also, in accordance with the present invention, each one of the well contact regions of the second conduction type, which is disposed for every two of the memory cells arranged in the second direction, is disposed for every one of the memory cells arranged along the first direction. The first direction is the direction of the word lines. In general, when one of the word lines is selected, all of the memory cells connected to the word line are operated. In the driver transistors of the selected memory cells, drain current flows at once, and substrate current is generated at once. In accordance with the present invention, a well contact region per each cell is disposed for every one of the memory cells that are operated. As a result, the substrate resistance at all of the driver transistors in operation is lowered, and therefore the latch-up can be prevented. On the other hand, a well contact region is formed for each predetermined number of memory cells arranged in the first direction in the well of the first conduction type where the load transistors are formed. The predetermined number is, for example, 32 or 64. The load transistors only maintain a high potential at cell nodes, and direct current does not flow through the load transistors unlike the driver transistors, such that its substrate current is small. Therefore, for example, when the well contact region of the first conduction type is provided for every 32 cells, and the well resistance becomes large (in particular, a memory cell located intermediate of one well contact region and another well contact region has the largest well resistance), latch-up does not occur.

In accordance with the present invention, the first conduction type and the second conduction type may be set as follows. For example, the first conduction type is n-type and the second conduction type is p-type. Alternatively, the first conduction type is p-type, and the second conduction type is n-type. In a semiconductor memory device in accordance with the present invention, the first conduction type may preferably be n-type and the second conduction type may preferably be p-type. With this structure, an n-type well contact region is provided for each specified number of memory cells arranged in the first direction, and a p-type well contact region is provided for each two of the memory cells arranged in the second direction. P-channel transistors that become load transistors are formed in the n-type wells. N-channel transistors that become driver transistors or transfer transistors are formed in the p-type wells. In is noted that substrate current in an n-channel transistor is generally larger than that in a p-channel transistor. For example, when the substrate current per unit channel length of an n-channel transistor is 1 e-6 A/$\mu$m, the substrate current per unit channel length of a p-channel transistor is 1 e-9 A/$\mu$m, which makes a third-digit difference.

In the structure in accordance with the present invention, the region where the n-channel transistor, having a large substrate current is formed, is close to a well contact region, and therefore the substrate resistance is lowered. As a result, the generation of latch-up can be prevented. On the other hand, for the p-channel transistors, a well contact region is provided for, for example, every thirty-two memory cells, and the substrate resistance at the p-channel transistors becomes high. However, the substrate current is small, and therefore latch-up does not occur. It is noted that, in a semiconductor memory device in accordance with the present invention, the p-type well contact region is connected to the grounding line within the cell. Therefore, grounding wiring exclusively used for the p-type well contacts are not required, and therefore the semiconductor memory device can be miniaturized.

The present invention includes a plurality of word lines extending in the first direction. The word lines include gate electrodes of the first and second transfer transistors. Word line intermediate regions, where the first and second gate electrode layers are positioned, and word line intermediate regions, where the well contact regions of the second conduction type, are alternately arranged. This is one embodiment of the present invention in which a well contact region of the second conduction type is provided for every two of the memory cells arranged in the second direction.

In accordance with the present invention, word lines are in linear patterns. The patterns of the word lines are linear. As a result, the word lines can be made shorter compared to word lines having partially curved patterns. Therefore, the present invention can lower the resistance of the word lines. Also, when a word line is in a partially curved pattern, the curved portion may become narrower, which results in a localized increase in the gate wiring resistance caused by narrow line effect in a salicide process. In accordance with the present invention, the patterns of the word lines are linear, and do not have curved portions. As a result, the narrow line effect, which may be caused by the curved portions, does not occur, and an increase in the word line resistance that may be caused by the narrow line effect can be prevented.

Also, in accordance with the present invention, since the word lines are in linear patterns, the well contact region of the second conduction type can be positioned in an empty space in an intermediate region between word lines, without having to enlarge the memory cell area. Accordingly, in accordance with the present invention, a dead space (which is an extra space added for each specified number of memory cells to form a well contact region of the second conduction type and wiring to supply a well potential) is not required, and therefore the size of the semiconductor memory device can be reduced.

The present invention includes a plurality of source contact layers, wherein, in each of the memory cells, the first and second drain-gate connection layers are located in a layer above the first and second gate electrode layers, source regions of the first and second driver transistors are located in a gate electrode interlayer region that is a region between the first gate electrode layer and the second gate electrode layer, and each of the source contact layers is contained in an area above each of the gate electrode interlayer regions.

In accordance with the present invention, the drain-gate connection layers are located in a layer above the gate electrode layers and the drain-drain connection layers. As a result, the source contact layer can be contained in an area above each of the gate electrode interlayer regions while avoiding contact between the drain-gate connection layers and the source contact layers. Accordingly, in accordance with the present invention, the parasitic resistance of the source section of the driver transistor can be reduced. Also, since the source regions can be provided with simpler patterns (for example, a rectangular pattern having a generally uniform width), process margins, in particular, photo-process margins, in the manufacturing step for manufacturing semiconductor memory devices, can be expanded, such that the measurement precision in the channel width of driver transistors can be enhanced. Accordingly, in accordance with the present invention, the operation of memory cells can be stabilized.

Also, in accordance with the present invention, since the source contact layer can be contained in an area above each of the gate electrode interlayer regions, the word lines can be made in linear lines. As a result, an extra area in reserve can be provided in a boundary region between adjacent memory cells located next to one another in the second direction, namely, in a word line interlayer region. Accordingly, in accordance with the present invention, one well contact region of the second conduction type can be provided for every two of the memory cells arranged in the second direction without hindering the miniaturization of the memory cells. In this embodiment, one well contact region is disposed for every two of the memory cells in the second direction. However, in the first direction that may present more problems in actual operation, one well contact region is disposed for each one of the memory cells. Therefore, in accordance with the present invention, miniaturization of memory cells and semiconductor memory devices and prevention of latch-up can be simultaneously accomplished.

In accordance with the present invention, regions, where the first and second load transistors are to be formed, are positioned at both sides in the first direction of the well contact region of the first conduction type. In accordance with the present invention, the substrate resistance can be reduced. More specifically, the first and second load transistors are formed in the well of the first conduction type. The well of the first conduction type needs to be extended in order to connect the well contact region of the first conduction type to the well of the first conduction type. If the well contact region of the first conduction type is separated from the region where the first and second load transistors are formed, the length of the extended section of the well of the first conduction type becomes greater, which results in an increase in the substrate resistance. In accordance with the present invention, since the regions, where the first and second load transistors are to be formed, are positioned at both sides in the first direction of the well contact region of the first conduction type, the length of the extended section of the well of the first conduction type can be made smaller. As a result, in accordance with the present invention, the substrate resistance can be reduced.

In accordance with the present invention, the first conduction type is an n-type, the second conduction type is an n-type. The invention further includes first, second, third and fourth conduction layers. The first gate electrode layer, the second gate electrode layer and an auxiliary word line are located in the first conduction layer. The first drain-drain connection layer, the second drain-drain connection layer, a power supply line, a first contact pad layer, a second contact pad layer and a third contact pad layer are located in the second conduction layer. The first drain-gate connection layer, the second drain-gate connection layer, a main word line, a fourth contact pad layer, a fifth contact pad layer and a sixth contact pad layer are located in the third conduction layer. A first bit line, a second bit line and a grounding line are located in the fourth conduction layer. The auxiliary word line extends in a first direction. The power supply line connects to a source region of the first load transistor, a source region of the second load transistor and the well contact region of the first conduction type. The first contact pad layer is used to connect the first bit line and a source/drain region of the first transfer transistor. The second contact pad layer is used to connect the second bit line and a source/drain region of the second transfer transistor. The third contact pad layer is used to connect the well contact region of the second conduction type, a source region of the first driver transistor and a source region of the second driver transistor to the grounding line. The main word line extends in the first direction. The fourth contact pad layer is used to connect the first bit line and the source/drain region of the first transfer transistor. The fifth contact pad layer is used to connect the second bit line and the source/drain region of the second transfer transistor. The sixth contact pad layer is used to connect the well contact region of the second conduction type, the source region of the first driver transistor and the source region of the second driver transistor to the grounding line. The first and second bit lines extend in a second direction perpendicularly traversing the first direction.

In accordance with the present invention, a variety of characteristics required for semiconductor memory devices (for example, reduction in size, reliability, stability and speed) can be enhanced in a well-balanced manner. The "reduction in size" means both reduction of the size of each memory cell itself and the reduction of the size of the device that can be realized by the fact that grounding wires exclusively used for well contacts of the second conduction type are not required. The enhanced "reliability" means improved reliability brought about by preventing latch-up. The enhanced "stability" means enhanced stability in the operation of memory cells, which is brought about by the reduced parasitic resistance in the driver transistors and the enhanced precision in the channel width. Also, the enhanced "speed" means shortened access time, which is brought about by the reduced word line resistance.

In accordance with the present invention, the first gate electrode layer, the second gate electrode layer, the first drain-drain connection layer and the second drain-drain connection layer are in linear patterns, and are disposed in parallel with one another.

DETAILED DESCRIPTION OF PREFERRED EMBODIMENTS

A semiconductor memory device in accordance with one embodiment of the present invention is described. In this embodiment, the semiconductor memory device of the present invention is applied to an SRAM. First, a general structure of the embodiment of the present invention is described. Then, the structure is described in detail, and lastly, advantages of the present embodiment are described.

[General Structure of the Present Embodiment]

A semiconductor memory device in accordance with the present embodiment is a type that forms one memory cell with six MOS field effect transistors. A part of the structure that forms flip-flops of the memory cell and the structure of the memory cell are separately described to show the general structure of the present embodiment.

{Structure of Part that Forms Flip-Flops of Memory Cell}

Figure 1:
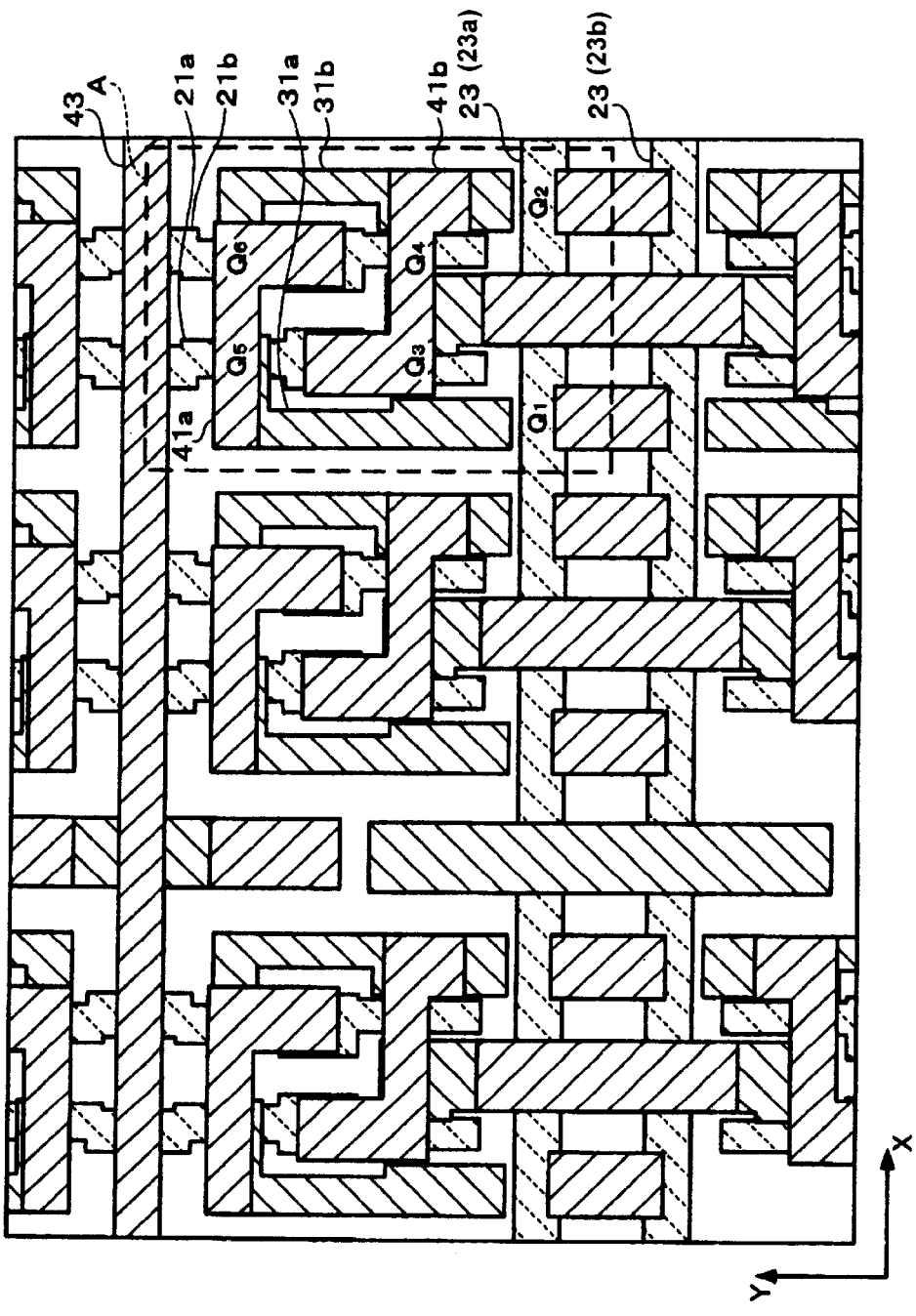
FIG. 1 is a plan view of first, second and third conduction layers in a part of a memory cell array in accordance with one embodiment of the present invention.

FIG. 1 is a plan view of part of a memory cell array in accordance with the present embodiment including first, second and third conduction layers. To facilitate understanding of FIG. 1, the first, second and third layers are individually described first.

Figure 3:
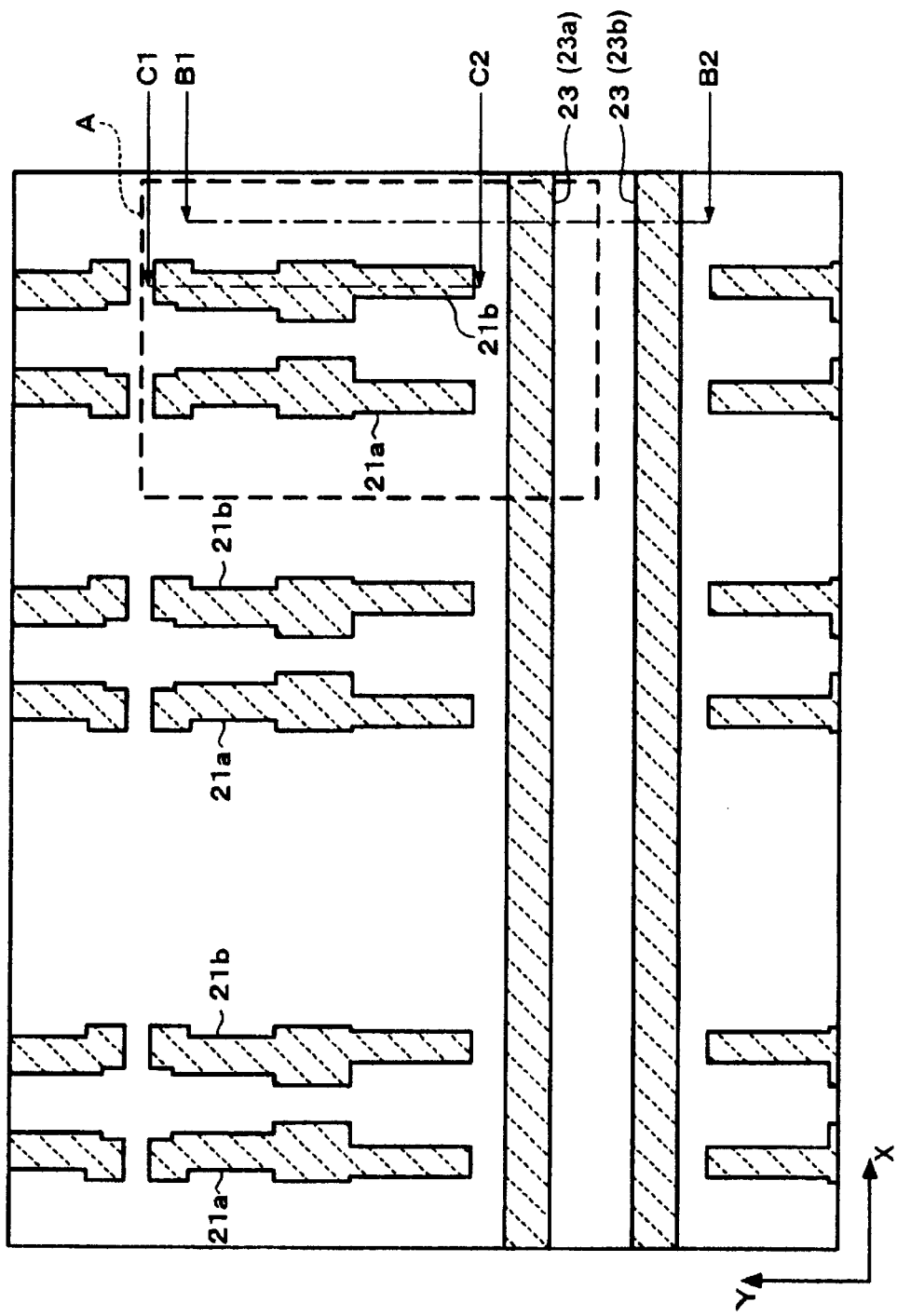
FIG. 3 is a plan view of a first conduction layer in a part of the memory cell array in accordance with one embodiment of the present invention.
Figure 5:
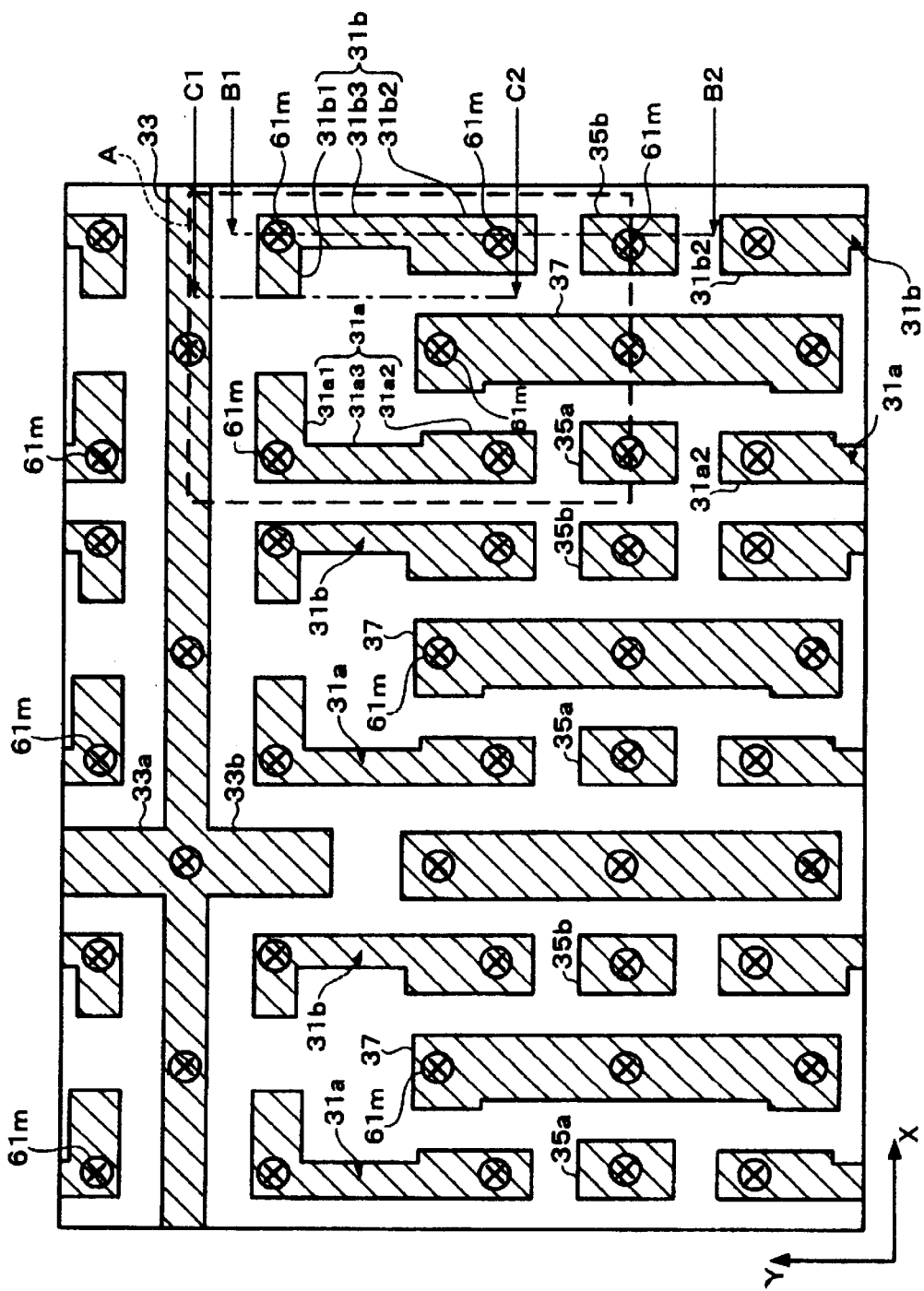
FIG. 5 is a plan view of a second conduction layer in a part of the memory cell array in accordance with one embodiment of the present invention.
Figure 8:
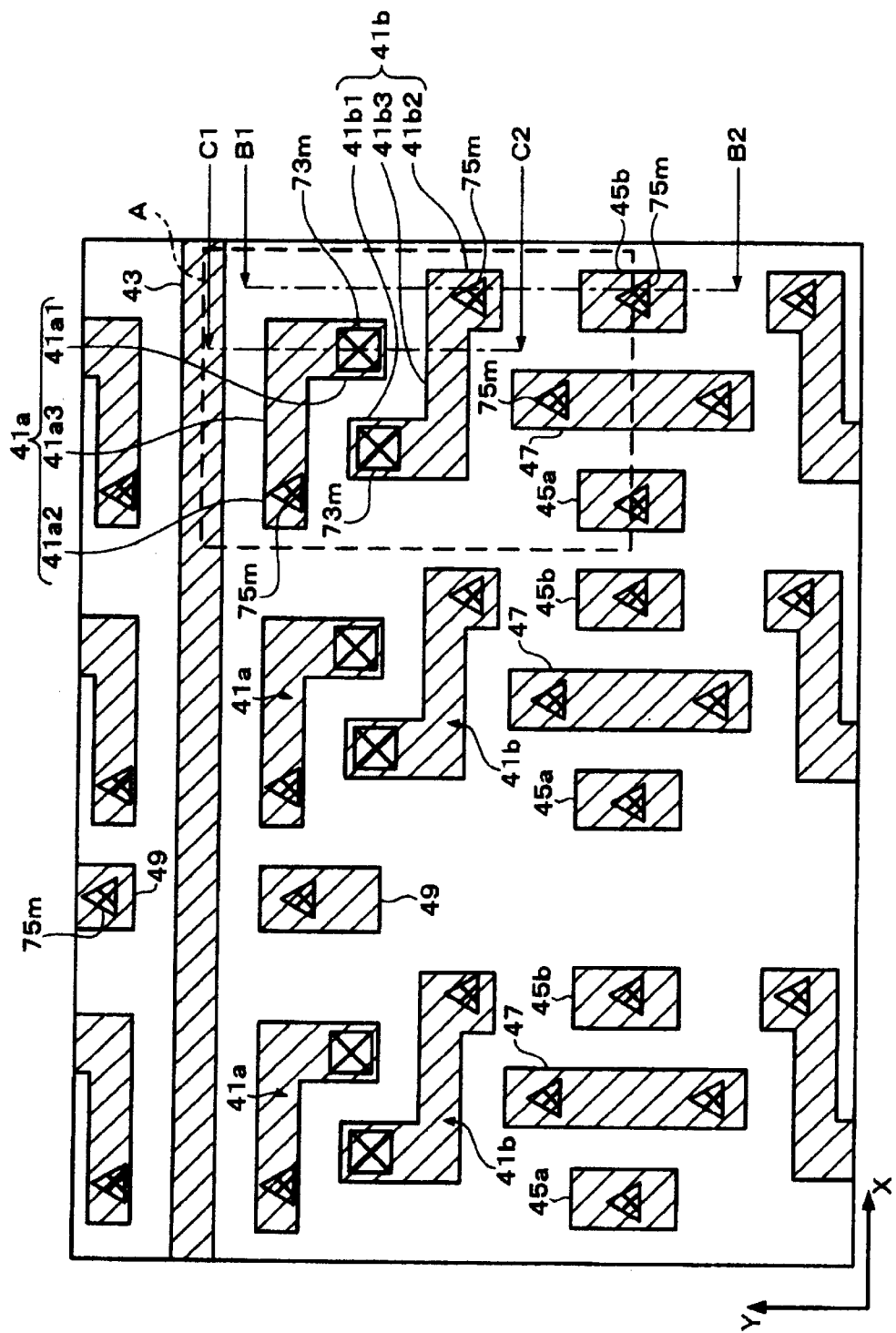
FIG. 8 is a plan view of a third conduction layer in a part of the memory cell array in accordance with one embodiment of the present invention.
Figure 9:
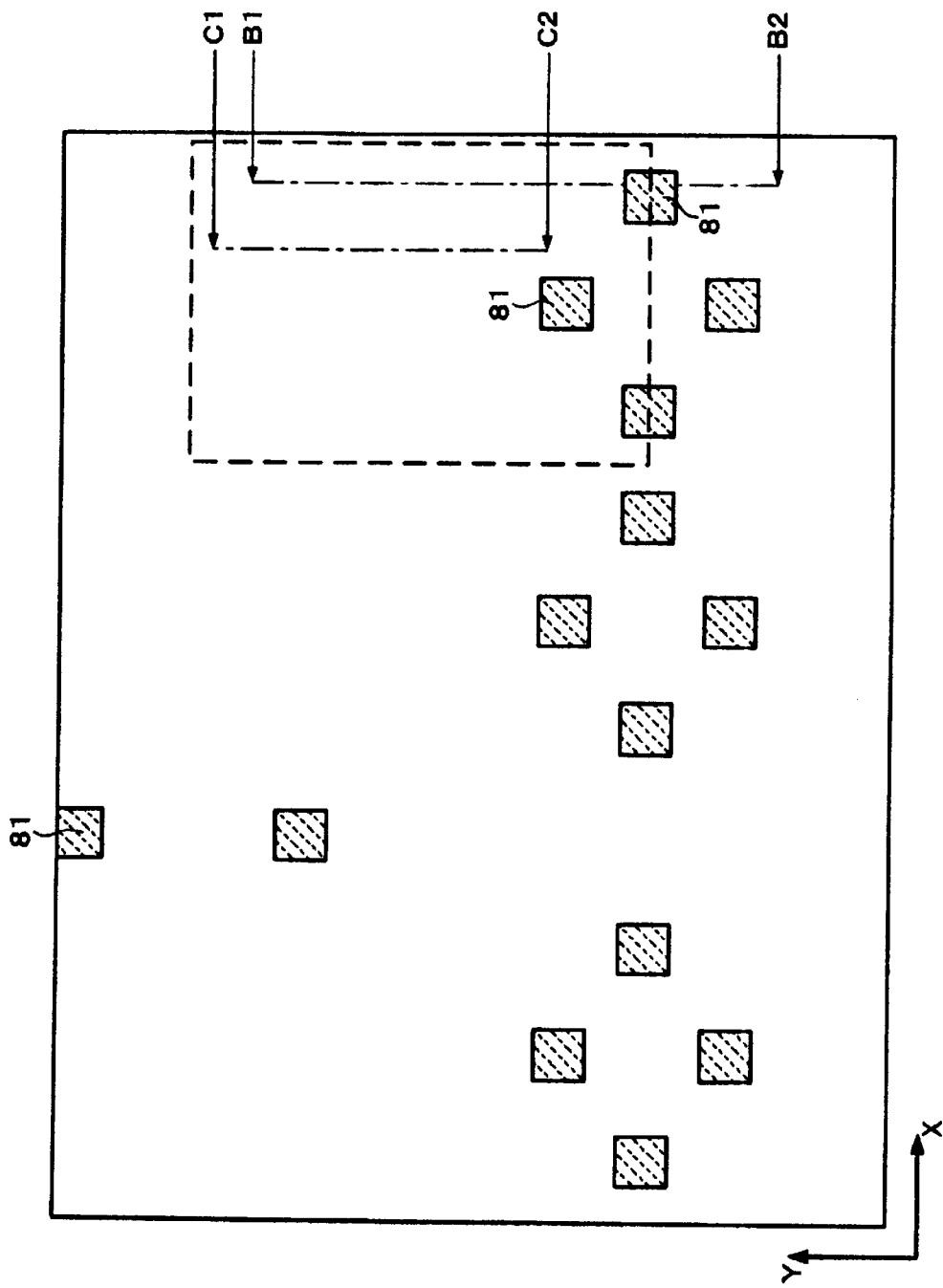
FIG. 9 is a plan view of a plug 81 in a part of the memory cell array in accordance with one embodiment of the present invention.

As shown in FIG. 3, gate electrode layers 21a and 21b and auxiliary word lines 23 are disposed in the first layer. As shown in FIG. 5, drain-drain connection layers 31a and 31b are disposed in the second layer. As shown in FIG. 8, drain-gate connection layers 41a and 41b are disposed in the third layer. A structure shown in FIG. 5 is located above the structure shown in FIG. 3, and a structure shown in FIG. 8 is located above the structure shown in FIG. 5. FIG. 1 shows these structures in one figure.

FIG. 1 shows a portion that forms a flip-flop. This is described focusing on a region A. The region A is a region where one memory cell is formed. The region A in the other figures has the same meaning.

Figure 16:
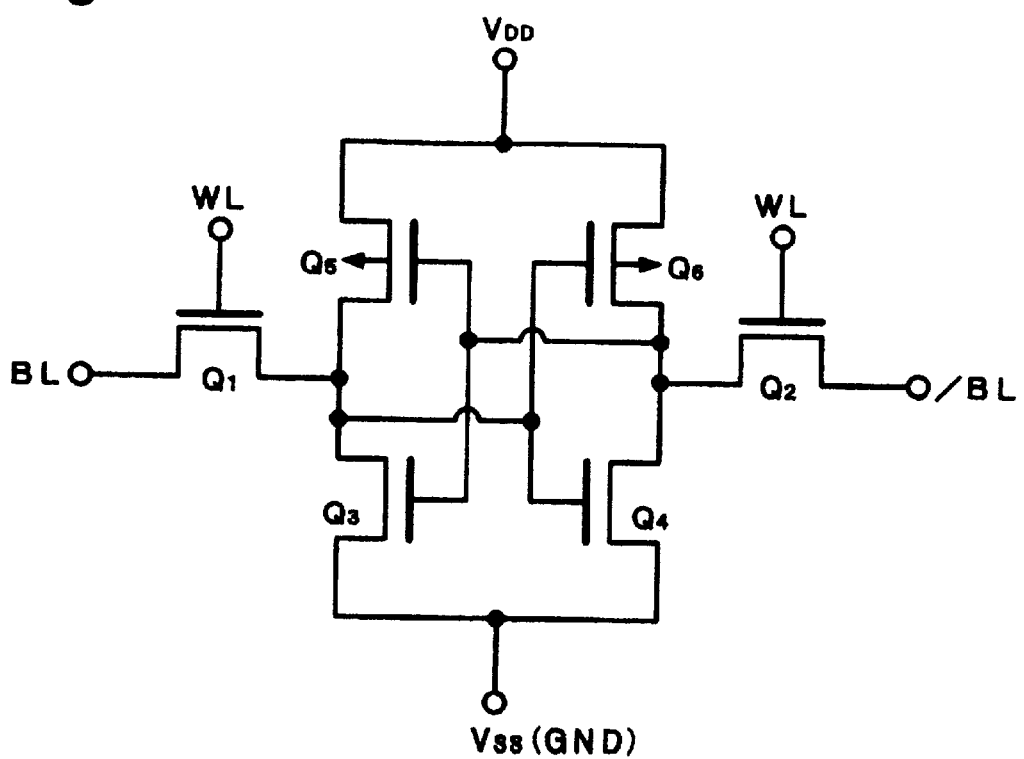
FIG. 16 is an an equivalent circuit of an SRAM in accordance with one embodiment the present invention.

In the region A, six MOS field effect transistors, namely, n-channel type transfer transistors $Q_1$ and $Q_2$, n-channel type driver transistors $Q_3$ and $Q_4$, and p-channel type load transistors $Q_5$ and $Q_6$ are formed. The driver transistor $Q_3$ and the load transistor $Q_5$ form one CMOS inverter. Also, the driver transistor $Q_4$ and the load transistor $Q_6$ form one CMOS inverter. These two CMOS inverters are cross-coupled to form a flip-flop. A circuit that is formed by the six MOS field effect transistors in Region A can be represented by an equivalent circuit shown in FIG. 16.

Referring to FIG. 1 again, the gate electrode layer 21a and the gate electrode layer 21b are formed from linear patterns, respectively. The gate electrode layer 21a forms gate electrodes of the driver transistor $Q_3$ and the load transistor $Q_5$, and also connects these electrodes to one another. Also, the gate electrode layer 21b forms gate electrodes of the driver transistor $Q_4$ and the load transistor $Q_6$, and further connects these electrodes to one another.

A drain of the driver transistor $Q_3$ and a drain of the load transistor $Q_5$ are connected by the drain-drain connection layer 31a. Also, a drain of the driver transistor $Q_4$ and a drain of the load transistor $Q_6$ are connected by the drain-drain connection layer 31b. The drain-drain connection layer 31a and the drain-drain connection layer 31b are formed from linear patterns, respectively.

Gate electrodes (the gate electrode layer 21a) of the driver transistor $Q_3$ and the load transistor $Q_5$ and the drain-drain connection layer 31b are connected by the drain-gate connection layer 41b. Also, gate electrodes (the gate electrode layer 21b) of the driver transistor $Q_4$ and the load transistor $Q_6$ and the drain-drain connection layer 31a are connected by the drain-gate connection layer 41a. The drain-gate connection layer 41a and the drain-gate connection layer 41b have patterns in a letter-L shape, respectively. A first side and a second side of each of the L-letter patterns generally form an angle of 90 degrees. The first side of the drain-gate connection layer 41a is opposed to the first side of the drain gate connection layer 41b. The second side of the drain-gate connection layer 41a is opposed to the second side of the drain-gate connection layer 41b. The drain-gate connection layer 41a and the drain-gate connection layer 41b are generally symmetrical about a point.

The gate electrode layer 21a, the gate electrode layer 21b, the drain-drain connection layer 31a and the drain-drain connection layer 31b are disposed in parallel with one another. The gate electrode layers 21a and 21b are located between the drain-drain connection layer 31a and the drain-drain connection layer 31b.

{Structure of Memory Cell}

Figure 2:
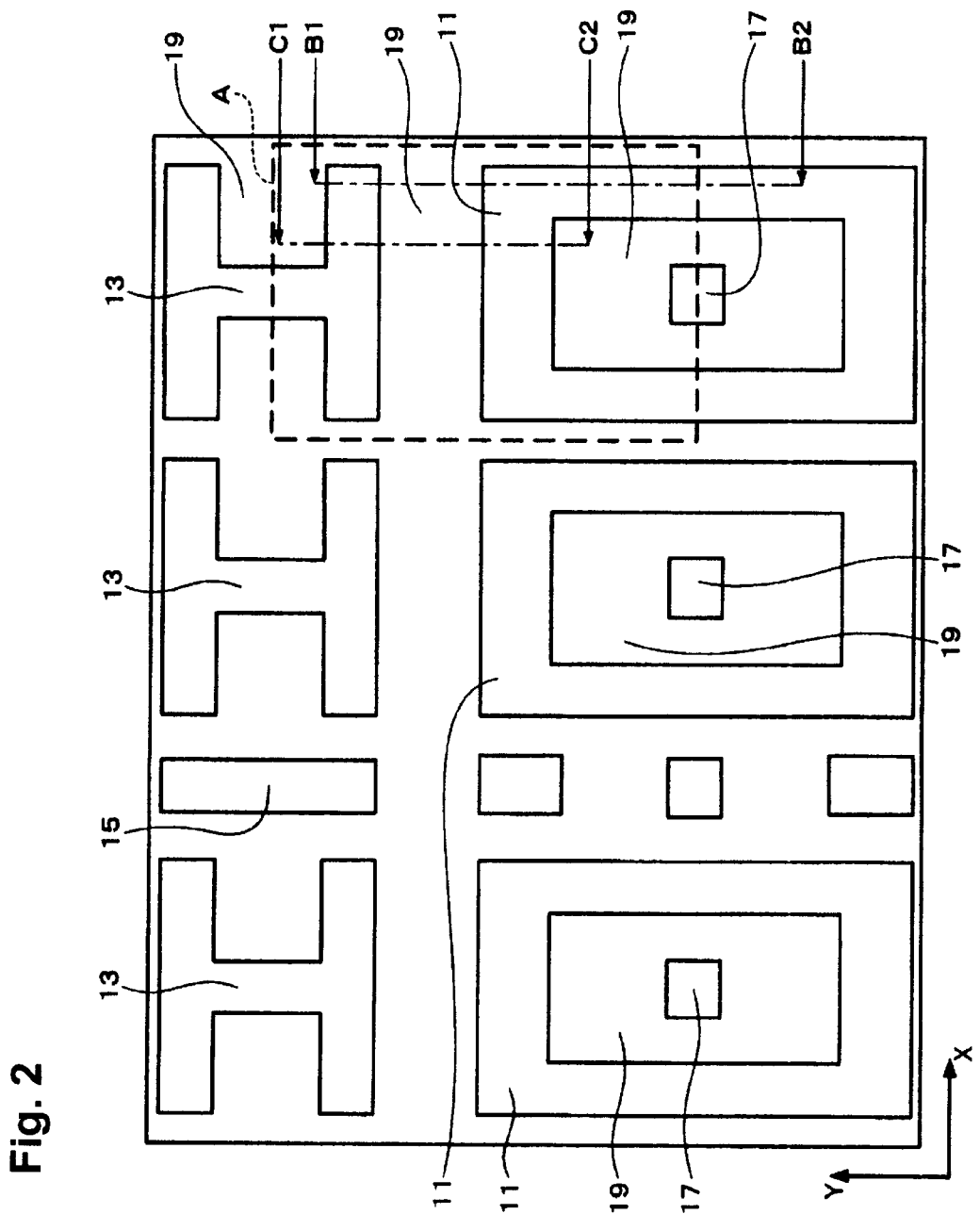
FIG. 2 is a plan view of a field in a part of the memory cell array in accordance with one embodiment of the present invention.
Figure 10:
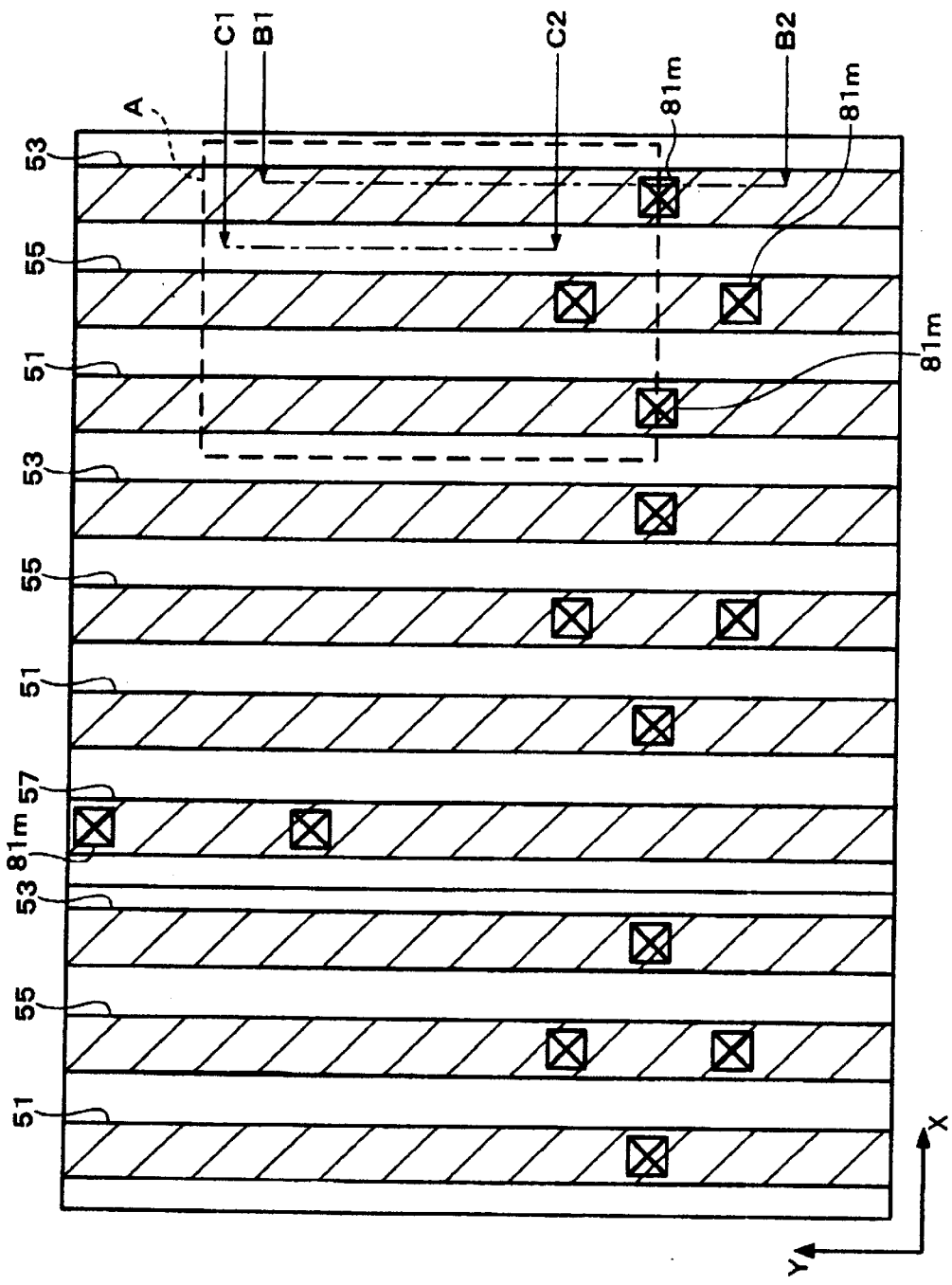
FIG. 10 is a plan view of a fourth conduction layer in a part of the memory cell array in accordance with one embodiment of the present invention.

Next, a structure of the memory cell in accordance with the present embodiment is described. The memory cell of the present embodiment has a structure in which first, second, third and fourth conduction layers are successively stacked in layers over a field with interlayer dielectric layers interposed between the layers. As shown in FIG. 2, the field is a region where active regions 11, 13, 15 and 17, and element isolation regions 19 are located. The fourth layer is a layer where bit lines 51 and the like are located, as shown in FIG. 10. The memory cell of the present embodiment has a structure in which the first, second and third conduction layers described above with reference to FIG. 1 are positioned over the field shown in FIG. 2, and the fourth conduction layer shown in FIG. 10 is positioned over these layers.

{Pattern of Memory Cell}

Figure 17:
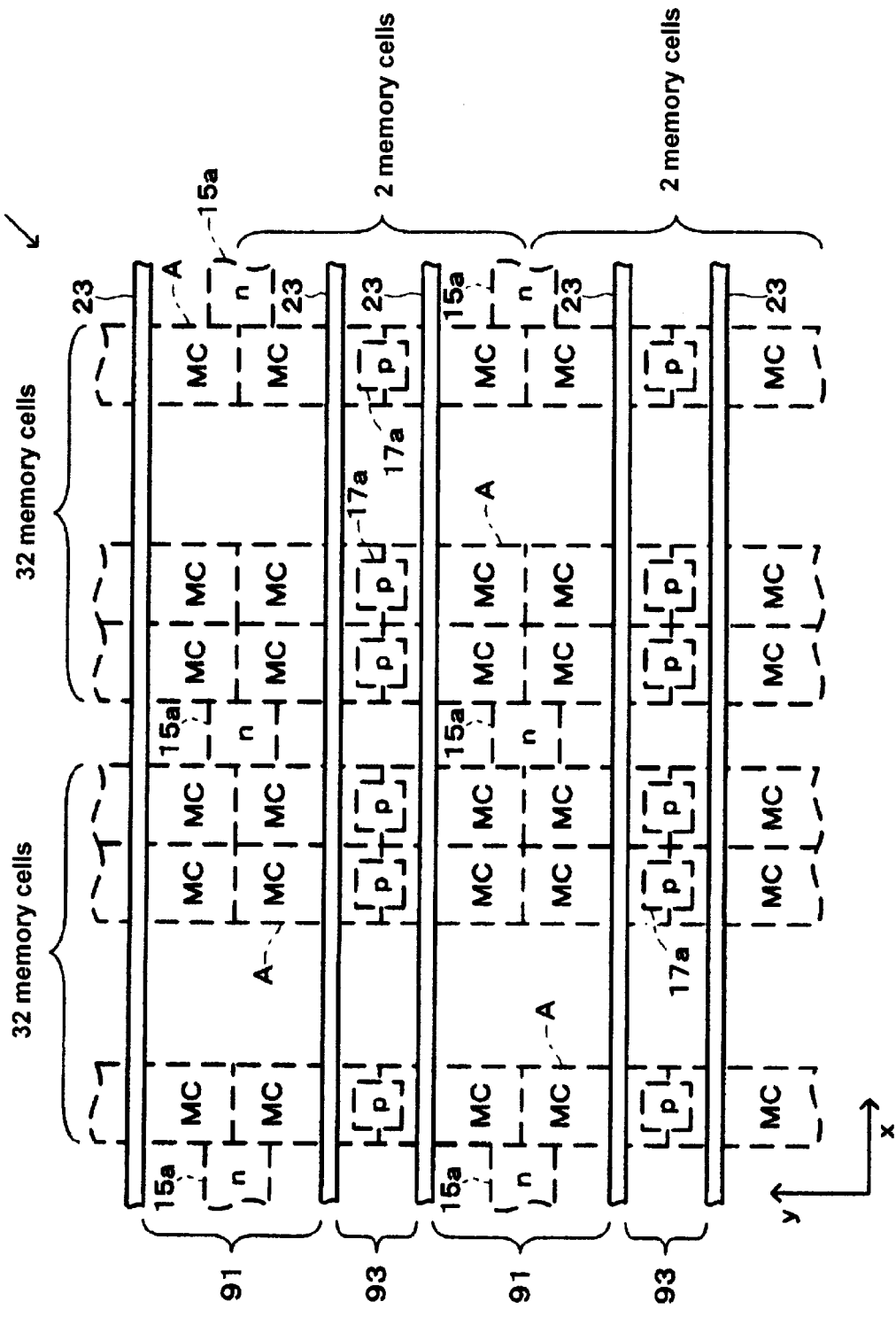
FIG. 17 is a plan view in part of a pattern of a memory cell array in accordance with one embodiment of the present invention.

FIG. 17 shows a plan view in part of a pattern of a memory cell array in accordance with the present embodiment. The memory cell array 1 has a structure in which plural memory cells MC are arranged in vertical and transverse directions. The memory cell array 1 is equipped with $n^+$ type well contact regions 15a and $p^+$ type well contact regions 17a. Each one of the $n^+$ type well contact regions 15a is provided for every thirty-two of the memory cells arranged in the X-direction. Each one of the $p^+$ type well contact regions 17a is provided for every two of the memory cells arranged in the Y-direction.

A plurality of word lines 23 extending in the X-axis direction are disposed in the memory cell array 1. Word line interlayer regions 91 and 93, which are regions between the word lines, are alternately disposed. Gate electrode layers are located in the word line interlayer regions 91. The $p^+$ type well contact regions 17a are located in the word line interlayer regions 93.

[Detailed Structure of the Embodiment]

Figure 12:
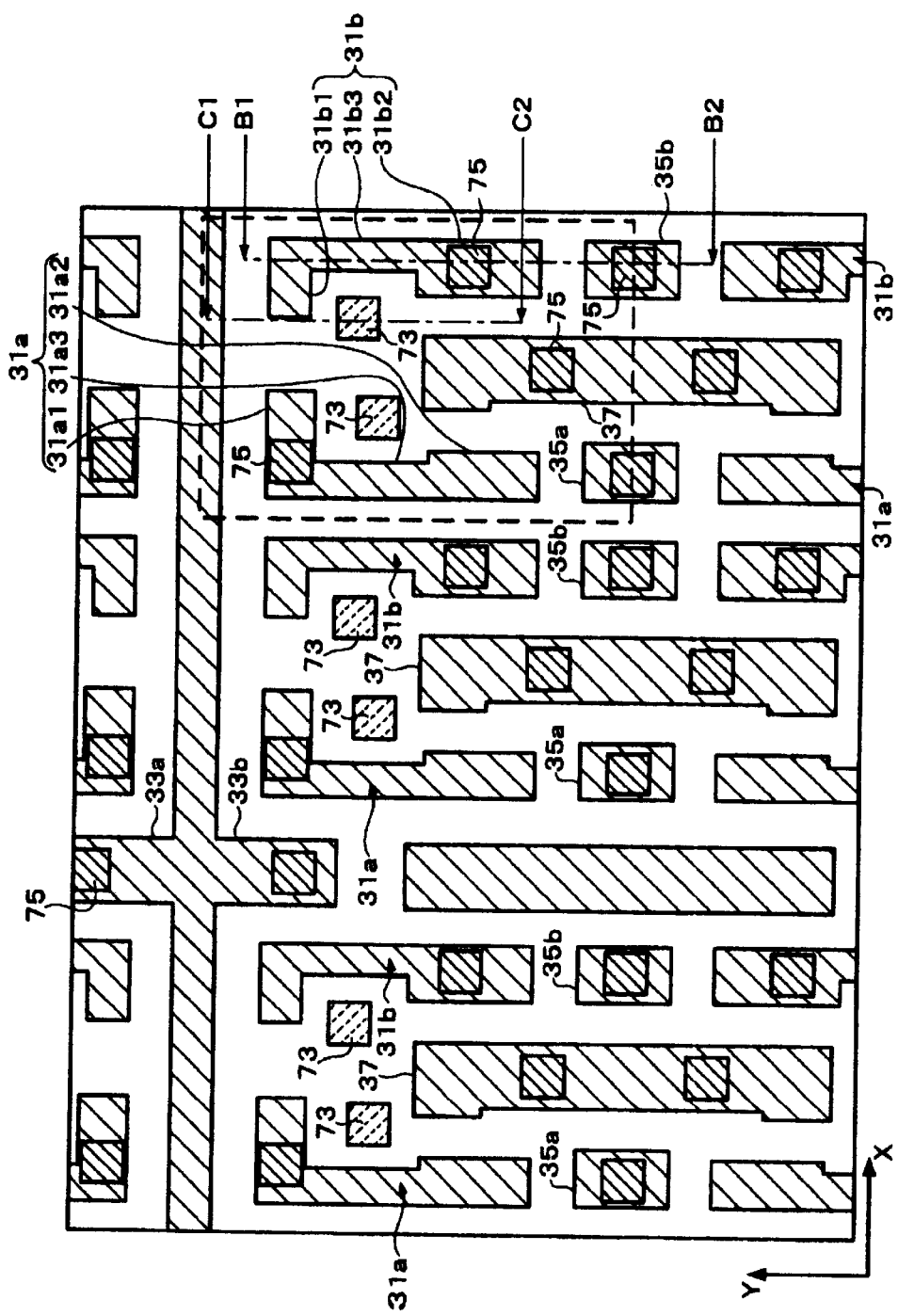
FIG. 12 is a plan view of the second layer and the plugs 73 and 75 in accordance with one embodiment of the present invention.
Figure 13:
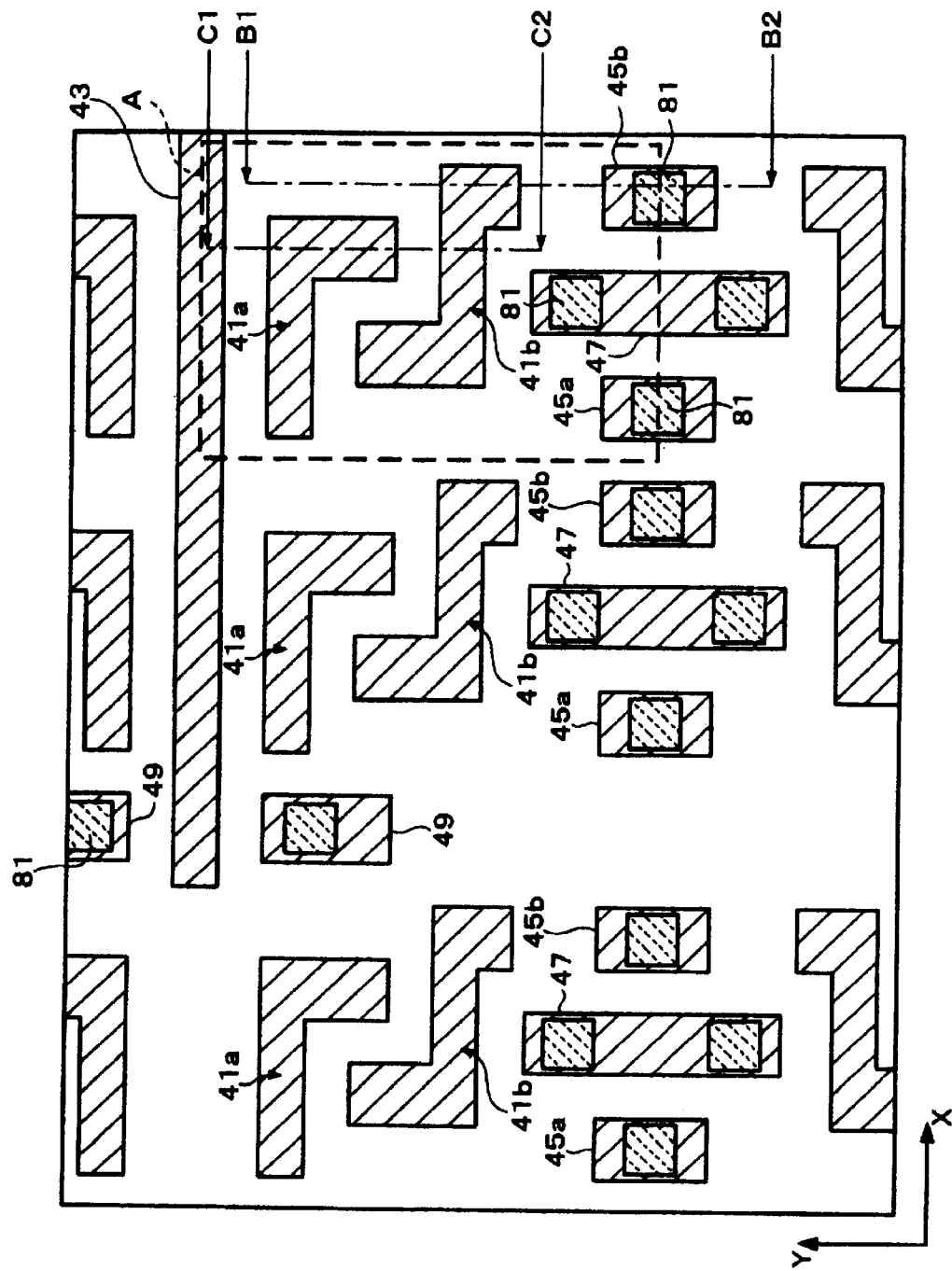
FIG. 13 is a plan view of the third layer and the plug 81 in accordance with one embodiment of the present invention.
Figure 14:
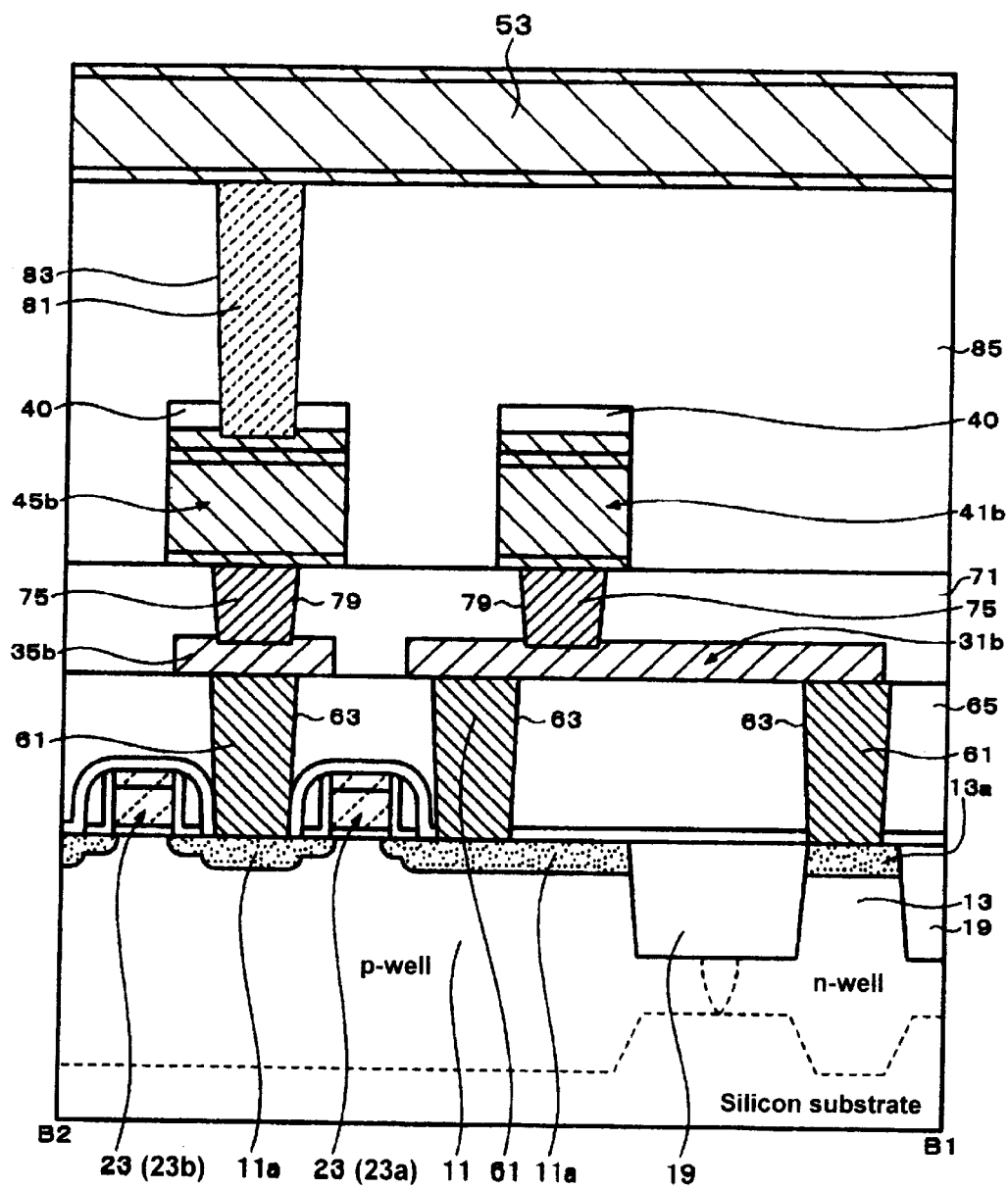
FIG. 14 is a cross-sectional view taken along lines B1–B2 shown in a plan view in accordance with one embodiment of the present invention.
Figure 15:
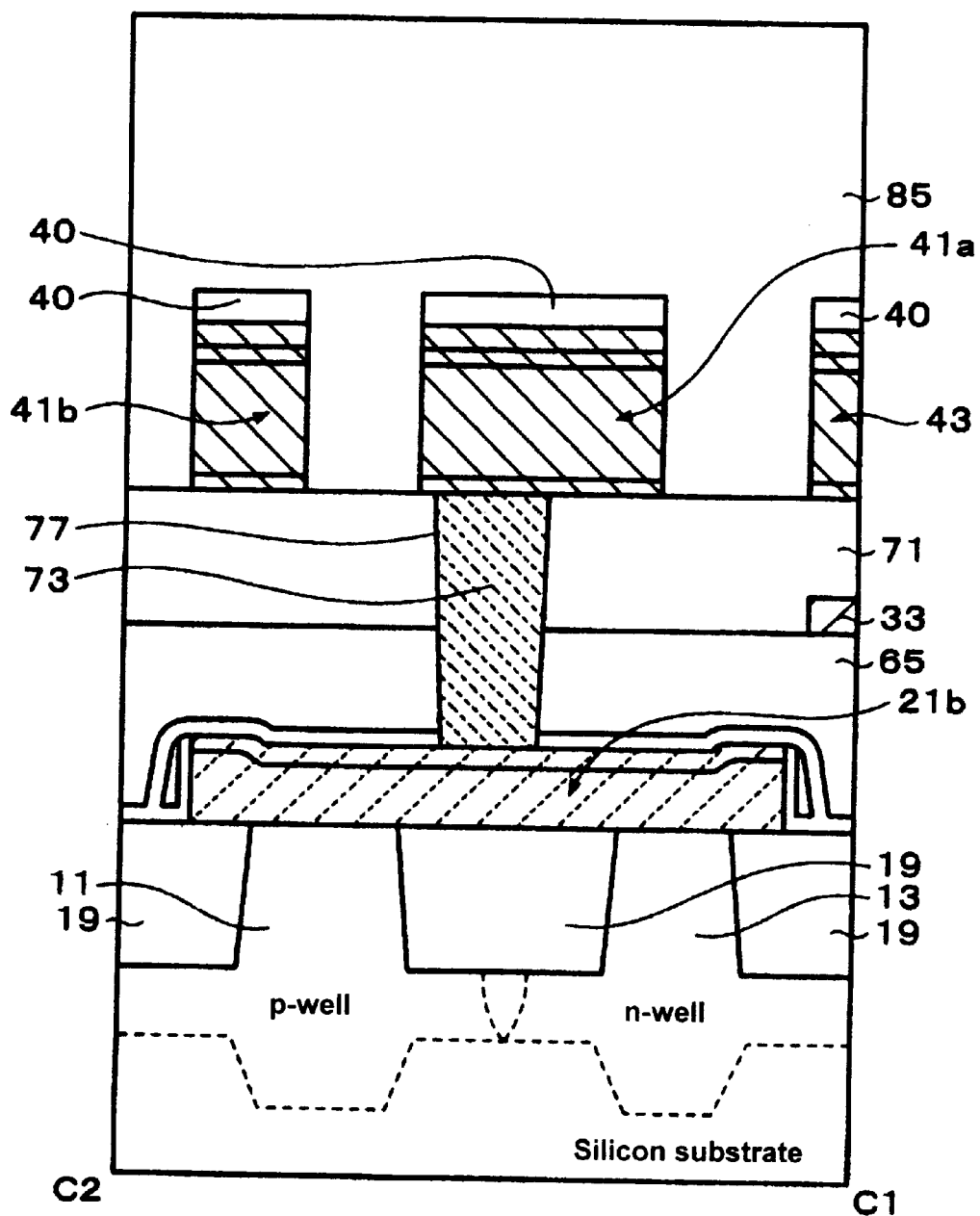
FIG. 15 is a cross-sectional view taken along lines C1–C2 shown in a plan view in accordance with one embodiment of the present invention.

The structure of the present embodiment is described in detail from the perspective of the bottom layer with reference to FIGS. 2–15. FIGS. 2–13 show plane B1–B2, and plane C1–C2. FIG. 14 is a cross-sectional view taken along the plane B1–B2, and FIG. 15 is a cross-sectional view taken along the plane C1–C2.

{Field, First Layer}

Figure 11:
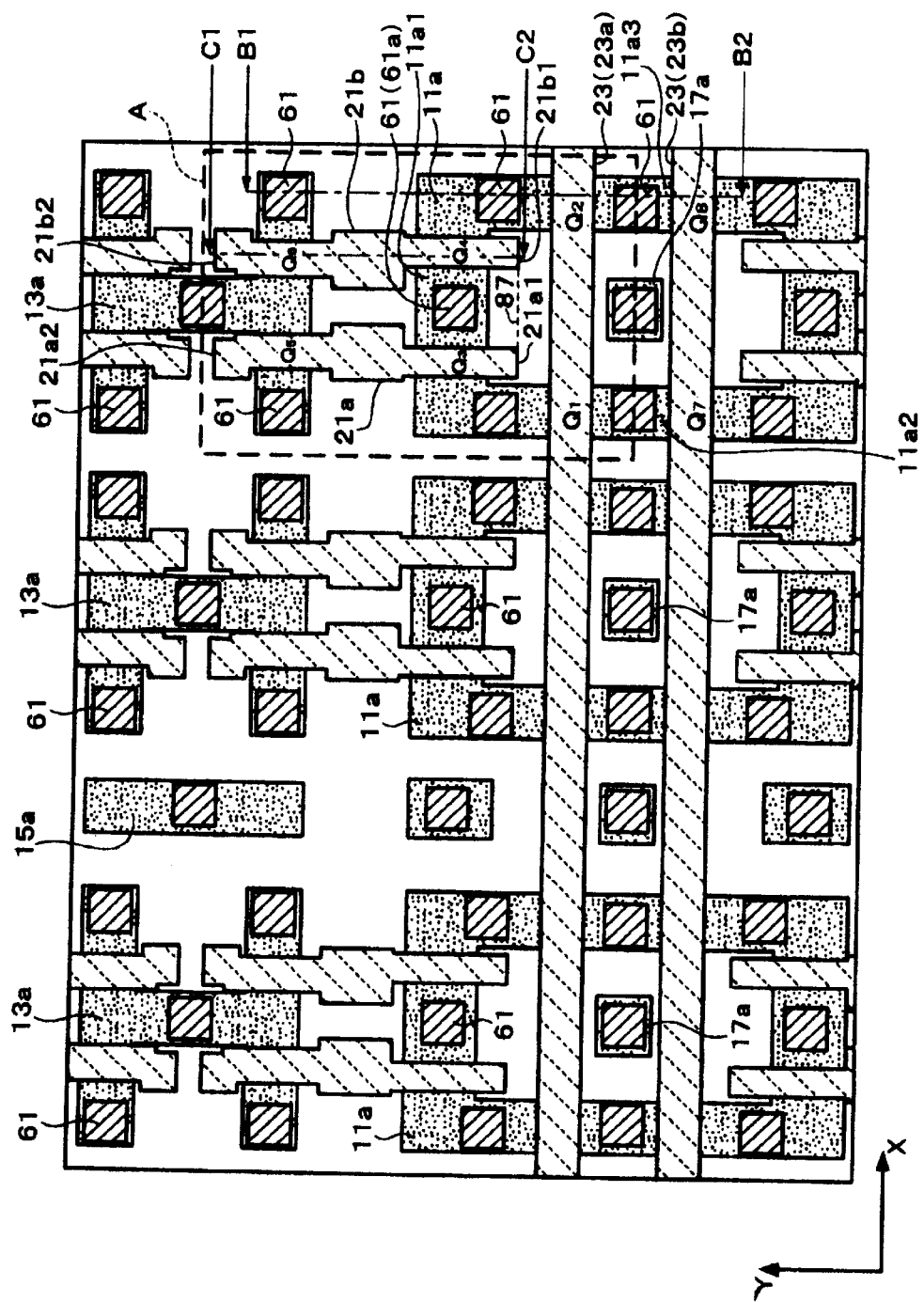
FIG. 11 is a plan view of the field, the first layer and the plug 61 in accordance with one embodiment of the present invention.

FIG. 11 is a plan view of the field and the first conduction layer. First, the field is described with reference to FIGS. 2, 14 and 15. FIG. 2 is a plan view of the field. The field includes active regions 11, 13, 15 and 17, and element isolation regions 19. The active regions 11, 13, 15 and 17 are formed on the surface of a silicon substrate.

The active region 11 has a generally rectangular frame shape. A plurality of the active regions 11 are arranged in the X-axis direction in FIG. 2. The transfer transistors $Q_1$ and $Q_2$ and the driver transistors $Q_3$ and $Q_4$ shown in FIG. 1 are formed in the active region 11.

The active region 13 generally is in a letter-H shape. A plurality of the active regions 13 are arranged in the X-axis direction in FIG. 2. The load transistors $Q_5$ and $Q_6$ shown in FIG. 1 are formed in the active region 13.

Each one of the active regions 15 is formed, for example, for every thirty-two (32) memory cells arranged in the X-axis direction. A well contact region for n-wells is formed in the active region 15. Accordingly, the n-wells corresponding to the thirty-two (32) memory cells are connected to a $V_{DD}$ wiring (power supply line) through the well contact region.

Each one of the active regions 17 is formed, for example, for every two memory cells arranged in the Y-axis direction. A well contact region for p-wells is formed in the active region 17. Accordingly, the p-wells corresponding to the two memory cells is connected to a $V_{SS}$ wiring (grounding line) through the well contact region.

The active regions 11, 13, 15 and 17 are isolated from other active regions by the element isolation regions 19 (having a depth of, for example, 400 nm). The element isolation regions 19 may be provided by, for example, STI (shallow trench isolation).

Cross-sectional views of the field shown in FIG. 2 taken along the plane B1–B2 and the plane C1–C2 are shown in FIG. 14 and FIG. 15, respectively.

The active regions 11 and 13 and the element isolation regions 19 appear in these cross-sectional views.

Next, the first layer positioned on the field is described with reference to FIG. 3, FIG. 11, FIG. 14 and FIG. 15. FIG. 3 is a plan view of the first conduction layer. A plurality of gate electrode layers 21a and 21b and a plurality of auxiliary word lines 23 are disposed in the first layer (the auxiliary word lines 23a and 23b appear in FIG. 3). The gate electrode layers 21a and 21b and the auxiliary word lines 23 have a structure in which, for example, a silicide layer is formed on a polysilicon layer.

Each of the gate electrode layers 21a and 21b has a linear pattern extending in the Y-axis direction in FIG. 3. One pair of the gate electrode layers 21a and 21b is disposed in parallel with each other in each one memory cell region. The gate electrode layers 21a and 21b become gate electrodes of the driver transistors $Q_3$ and $Q_4$ and the load transistors $Q_5$ and $Q_6$ shown in FIG. 1. The gate length of each of the driver transistors $Q_3$ and $Q_4$ is, for example, 0.18 μm, and the gate length of each of the load transistors $Q_5$ and $Q_6$ shown is, for example, 0.20 μm.

Each of the auxiliary word lines 23 has a linear pattern extending in the X-axis direction in FIG. 3. The auxiliary word lines 23 are located on the side of the driver transistors. The auxiliary word lines 23 are activated or inactivated by main word lines located in an upper layer. The auxiliary word lines 23 become gate electrodes of the transfer transistors (the auxiliary word lines 23a become gate electrodes of the transfer transistors $Q_1$ and $Q_2$ shown in FIG. 1). The gate length of each of transfer transistors is, for example, 0.24 μm.

Cross-sectional views of the first layer shown in FIG. 3 taken along the plane B1–B2 and the plane C1–C2 are shown in FIG. 14 and FIG. 15, respectively. The auxiliary word lines 23a and 23b and the gate electrode layers 21b appear in these cross-sectional views.

Next, source/drain regions and the like that are formed in the active regions are described. As shown in FIG. 11, n$^+$ type source/drain regions 11a are formed in the active regions 11. P$^+$ type source/drain regions 13a are formed in the active regions 13. N$^+$ type well contact regions 15a are formed in the active regions 15. N$^+$ type well contact regions 17a are formed in the active regions 17.

The "source/drain region" means a region that functions as at least one of a source and a drain. It is noted that the n$^+$ type source/drain region 11a2 is the n$^+$ type source/drain region 11a that is commonly used by the transfer transistor $Q_1$ and the transfer transistor $Q_7$ that has the auxiliary word line 23b as its gate electrode. The n$^+$ type source/drain region 11a3 is the n$^+$ type source/drain region 11a that is commonly used by the transfer transistor $Q_2$ and the transfer transistor $Q_8$ that has the auxiliary word line 23b as its gate electrode.

Figure 4:
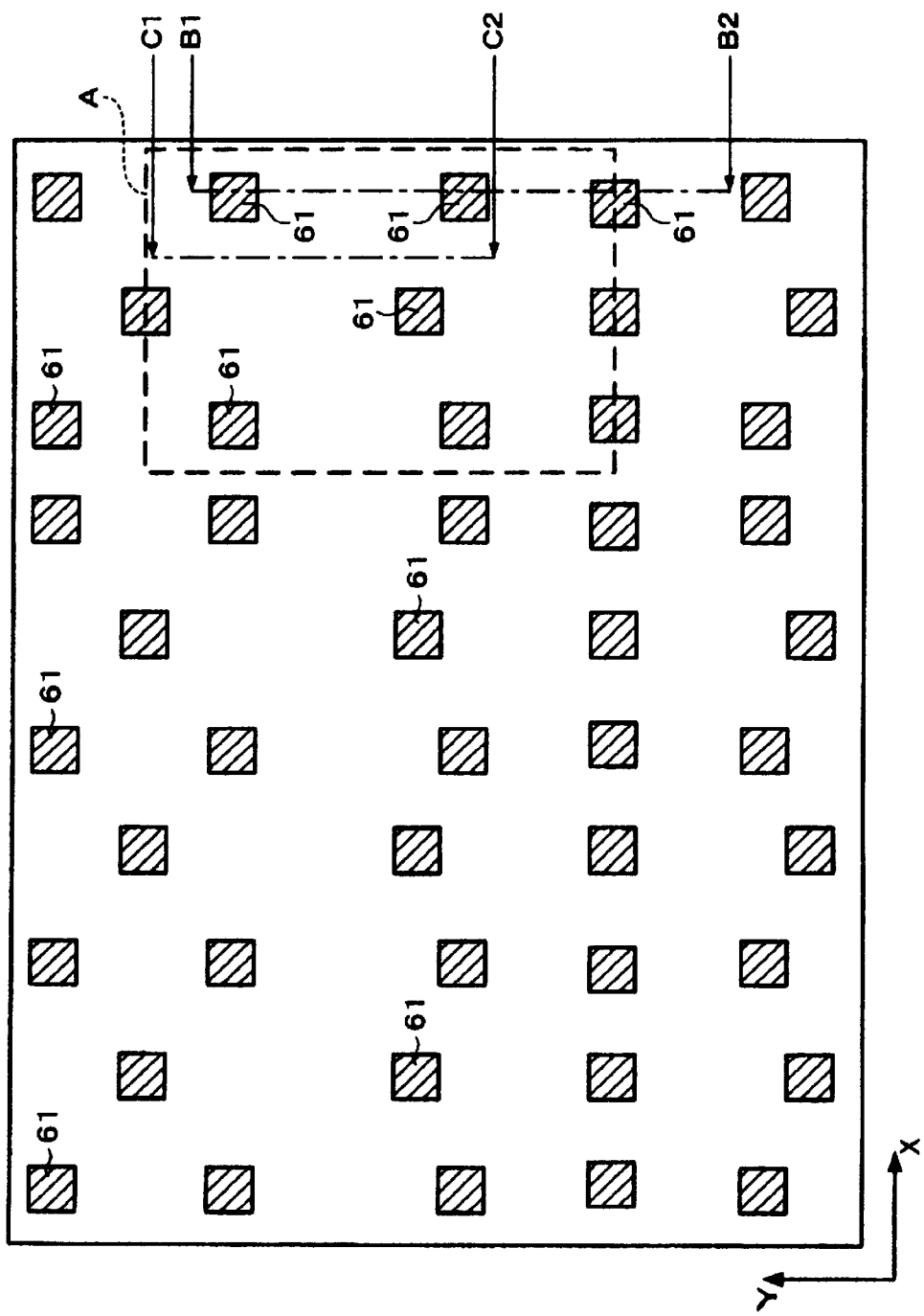
FIG. 4 is a plan view of a plug 61 in a part of the memory cell array in accordance with one embodiment of the present invention.

An interlayer dielectric layer, such as, for example, a silicon oxide layer (not shown in FIG. 11) is formed in a manner to cover the field and the first layer. As shown in FIG. 14 and FIG. 15, the interlayer dielectric layer 65 is processed by CMP for planarization. A plurality of contact holes 63 are formed in the interlayer dielectric layer 65, which expose the n$^+$ type source/drain regions 11a and the like. Plugs 61 are embedded in the contact holes 63. The plugs 61 are connected to the n$^+$ type source/drain regions 11a, the p$^+$ type source/drain regions 13a, the n$^+$ type well contact regions 15a, and the p$^+$ type well contact regions 17a. The plugs 61 have patterns as shown in FIG. 4 in plan view. Tungsten, for example, can be used as a material for the plugs 61. The diameter of the contact hole 63 at its upper end section is, for example, 0.30 μm, and at its lower end section is, for example, 0.24 μm.

{Second Layer}

The second layer is structurally located above the structure shown in FIG. 11. As shown in FIG. 5, a plurality of drain-drain connection layers 31a and 31b, $V_{DD}$ wiring 33, a plurality of BL (bit line) contact pad layers 35a and 35b, and a plurality of $V_{SS}$ local wirings 37 are disposed in the second conduction layer. They have a structure in which, for example, a titanium nitride layer (having a thickness of, for example, 135 nm) is formed on an underlying titanium layer (having a thickness of, for example, 8.5 nm).

The drain-drain connection layers 31a and 31b have linear patterns extending in the Y-axis direction in FIG. 5, respectively. A main body section 31a3 of the drain-drain connection layer 31a has a width smaller than a width of either of the end sections 31a1 and 31a2 of the drain-drain connection layer 31a. In a similar manner, a main body section 31b3 of the drain-drain connection layer 31b has a width smaller than a width of either of the end sections 31b1 and 31b2 of the drain-drain connection layer 31b. The width of each of the main body section 31a3 and the main body section 31b3 is a minimum value on the design rule. One set of the drain-drain connection layers 31a and 31b are disposed in every one memory cell region. As shown in FIG. 1, as viewed in plan view, one set of the gate electrode layers 21a and 21b are located between the drain-drain connection layer 31a and the drain-drain connection layer 31b.

The $V_{SS}$ local wiring 37 has a linear pattern extending in the Y-axis direction in FIG. 5. The width of end sections of the $V_{SS}$ local wiring 37 is greater than a width of a main body section of the $V_{SS}$ local wiring 37. The $V_{SS}$ local wiring 37 is located between the end section 31a2 of the drain-drain connection layer 31a and the end section 31b2 of the drain-drain connection layer 31b. From this point, the $V_{SS}$ local wiring 37 extends to an area between the end section 31a2 of the drain-drain connection layer 31a and the end section 31b2 of the drain-drain connection layer 31b of a memory cell located therebelow in FIG. 5. Each one of the $V_{SS}$ local wirings 37 is disposed for every two of the memory cells.

The BL contact pad layer 35a functions as a pad layer to connect the bit line and the n$^+$ type source/drain region 11a2 (see FIG. 11). Similarly, the BL contact pad layer 35b functions as a pad layer to connect the bit line and the n$^+$ type source/drain region 11a3.

The BL contact pad layer 35a is located between the drain-drain connection layer 31a of one memory cell and the drain-drain connection layer 31a of another memory cell located below in FIG. 5. Similarly, the BL contact pad layer 35b is located between the drain-drain connection layer 31b of one memory cell and the drain-drain connection layer 31b of another memory cell located therebelow in FIG. 5. Each one of the BL contact pad layers 35a and 35b is disposed for every two memory cells.

The $V_{DD}$ wiring 33 has a linear pattern extending in the X-axis direction in FIG. 5. The $V_{DD}$ wiring 33 extends three-dimensionally across the n$^+$ type well contact region 15a (see FIG. 11). The $V_{DD}$ wiring 33 has branch sections 33a and 33b above the n$^+$ type well contact region 15a.

The drain-drain connection layers 31a and 31b, the $V_{DD}$ wiring 33, the BL contact pad layers 35a and 35b, and the $V_{SS}$ local wirings 37 located in the second layer shown in FIG. 5 are connected to the plugs 61 shown in FIG. 11. These connected sections are shown in FIG. 5 as contact sections 61m.

FIG. 14 is a cross-sectional view of the second layer shown in FIG. 5 taken along plane B1–B2. The drain-drain connection layer 31b and the BL contact pad layer 35b appear in the cross-sectional view.

An interlayer dielectric layer, such as, for example, a silicon oxide layer (not shown in FIG. 5) is formed in a manner to cover the second layer. As shown in FIG. 14 and FIG. 15, the interlayer dielectric layer 71 is processed by CMP for planarization. A plurality of through holes 79 are formed in the interlayer dielectric layer 71, which expose the drain-drain connection layer 31b and the like. Plugs 75 are embedded in the through holes 79. Also, as shown in FIG. 15, through holes 77 are formed in the interlayer dielectric layers 71 and 65, which expose the gate electrode layers 21b. Plugs 73 are embedded in the through holes 77. FIG. 12 is a plan view of the relationships between the plugs 73 and 75 and the second conduction layer.

Figure 6:
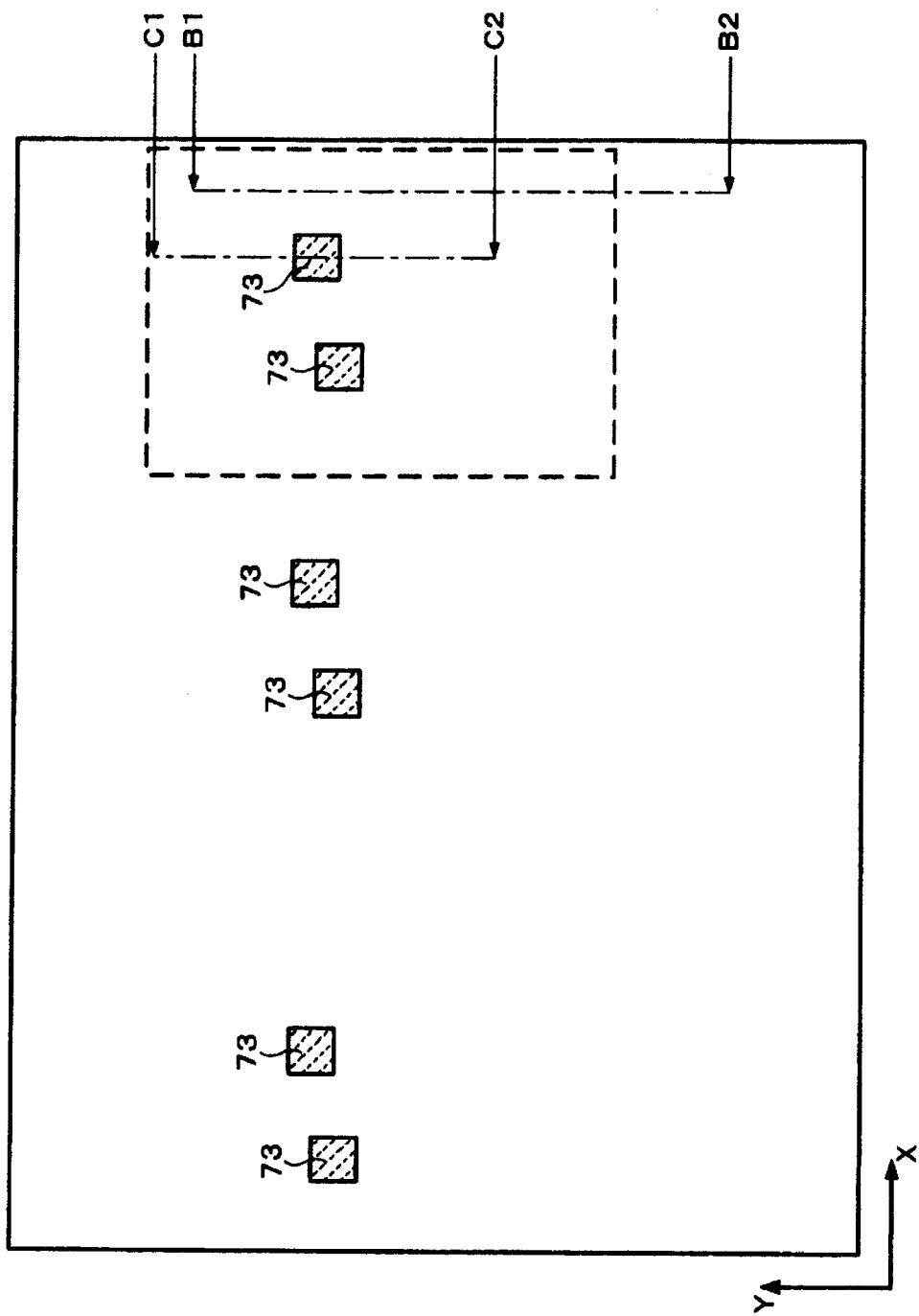
FIG. 6 is a plan view of a plug 73 in a part of the memory cell array in accordance with one embodiment of the present invention.

The plugs 73 are described below. The plugs 73 are disposed in plan view as shown in FIG. 6. The plugs 73 are connected to the gate electrode layers 21a and 21b (see FIG. 3). FIG. 15 is a cross-sectional view of the plug 73 and is described below. The plug 73 is embedded in the through hole 77 that passes through the two interlayer dielectric layers 65 and 71. The plug 73 is connected to the gate electrode layer 21b as shown in this cross-sectional view. Tungsten, for example, can be used as a material of the plugs 73. The diameter of the through hole 77 at its upper end section is, for example, 0.32 μm, and at its lower end section is, for example, 0.24 μm.

Figure 7:
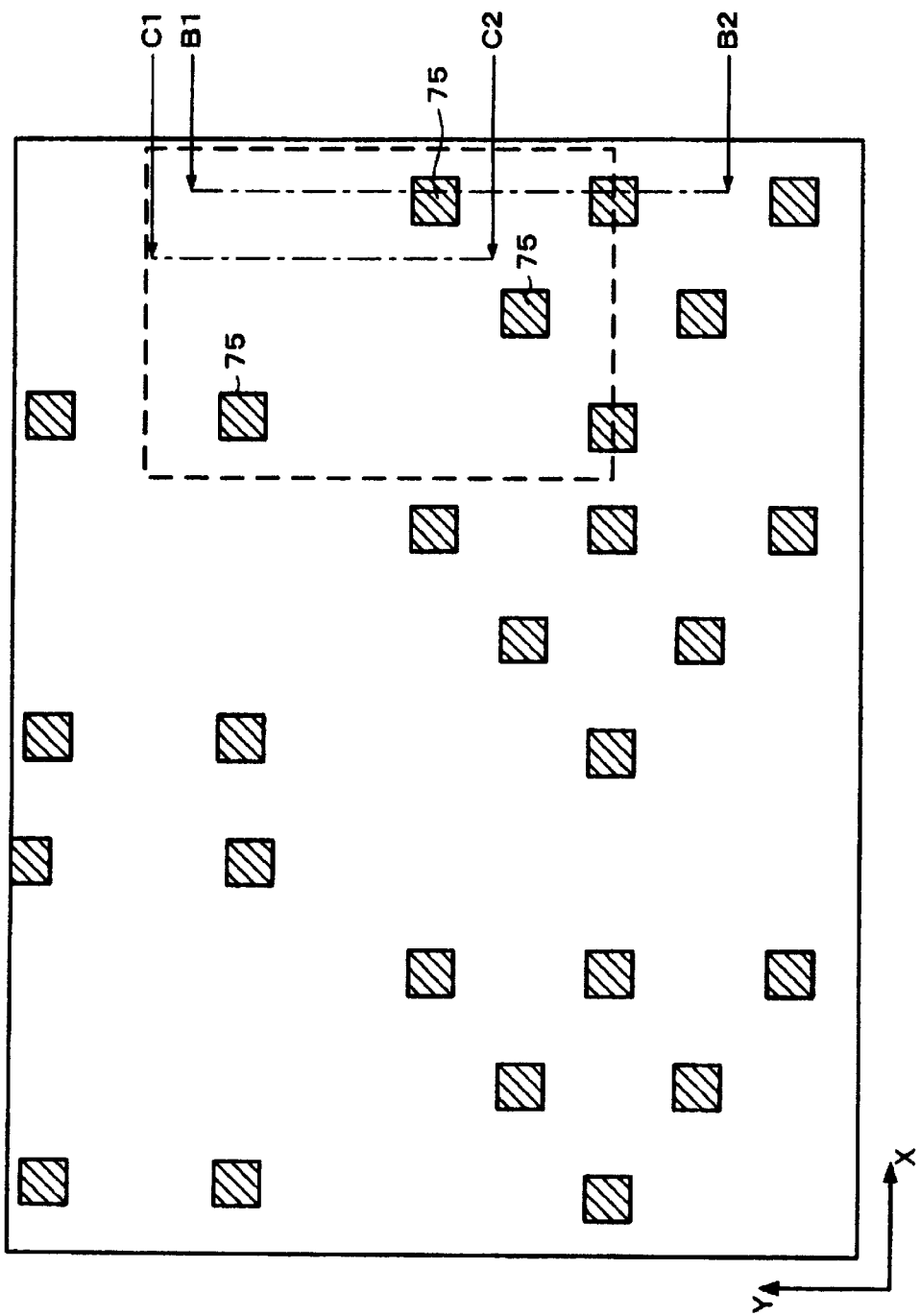
FIG. 7 is a plan view of a plug 75 in a part of the memory cell array in accordance with one embodiment of the present invention.

The plugs 75 are described below. The plugs 75 are disposed in plan view as shown in FIG. 7. The plugs 75 are connected to the drain-drain connection layers 31a and 31b, the branch sections 33a and 33b of the $V_{DD}$ wiring 33, the BL contact pad layers 35a and 35b, and the $V_{SS}$ local wirings 37. FIG. 14 is a cross-sectional view of the plug 75 and is described below. The plug 75 is embedded in the through hole 79 that passes through the interlayer dielectric layer 71. The plug 75 is connected to the drain-drain connection layer 31b and the BL contact pad layer 35b as shown in this cross-sectional view. Tungsten, for example, can be used as a material of the plugs 75. The diameter of the through hole 79 at its upper end section is, for example, 0.30 μm, and at its lower end section is, for example, 0.24 μm.

{Third Layer}

The third layer is structurally located above the structure shown in FIG. 12. As shown in FIG. 8, a plurality of drain-gate connection layers 41a and 41b, main word lines 43, a plurality of BL contact pad layers 45a and 45b, a plurality of $V_{SS}$ contact pad layers 47, and a plurality of $V_{DD}$ contact pad layers 49 are disposed in the third conduction layer. They have a structure in which, for example, from the bottom layer, a titanium nitride layer, an aluminum-copper alloy layer, a titanium layer and a titanium nitride layer are successively stacked in layers.

The drain-gate connection layer 41a has a main body section 41a3 and two end sections 41a1 and 41a2. The main body section 41a3 is a section that extends in the X-axis direction in FIG. 8. The end section 41a1 is a section that bends toward the side of the drain-gate connection layer 41b. Similarly, the drain-gate connection layer 41b has a main body section 41b3 and two end sections 41b1 and 41b2. The main body section 41b3 is a section that extends in the X-axis direction in FIG. 8. The end section 41b1 is a section that bends toward the side of the drain-gate connection layer 41a. One set of the drain-gate connection layers 41a and 41b are disposed in each one of the memory cell regions.

The BL contact pad layer 45a functions as a pad layer to connect the bit line and the n$^+$ type source/drain region 11a2. Similarly, the BL contact pad layer 45b functions as a pad layer to connect the bit line and the n$^+$ type source/drain region 11a3. Each of the BL contact pad layers 45a and 45b is disposed for every two memory cells.

The $V_{SS}$ contact pad layer 47 extends in the Y-axis direction in FIG. 8 and has two end sections. The $V_{SS}$ contact pad layer 47 is located between the BL contact pad layer 45a and the BL contact pad layer 45b. Each one of the $V_{SS}$ contact pad layers 47 is disposed for every two of the memory cells.

The main word line 43 linearly extends in the X-axis direction in FIG. 8. The main word line 43 is located above the $V_{DD}$ wiring 33 shown in FIG. 5. The $V_{DD}$ contact pad layers 49 are located above the branch sections 33a and 33b of the $V_{DD}$ wiring 33 shown in FIG. 5.

The end section 41a1 of the drain-gate connection layer 41a and the end section 41b1 of the drain-gate connection layer 41b are connected to the plugs 73 shown in FIG. 12, respectively. These connected sections are shown in FIG. 8 as contact sections 73m. The end section 41a2 of the drain-gate connection layer 41a, the end section 41b2 of the drain-gate connection layer 41b, the BL contact pad layers 45a and 45b, the $V_{SS}$ contact pad layer 47 and the $V_{DD}$ contact pad layer 49 are connected to the plugs 75 shown in FIG. 12. These connected sections are shown in FIG. 8 as contact sections 75m.

FIGS. 14 and 15 are cross-sectional views of the third layer shown in FIG. 3 taken along plane B1–B2 and plane C1–C2, respectively. The drain-gate connection layers 41a and 41b, the BL contact pad layer 45b and the main word line 43 appear in these cross-sectional views. A hard mask layer 40 formed of a silicon oxide layer is formed on the third conduction layer including these layers. The third conduction layer is patterned using the hard mask layer 40. This is performed because it is difficult to pattern the third conduction layer using only a resist as a mask due to the miniaturized memory cell.

An interlayer dielectric layer, such as, for example, a silicon oxide layer is formed in a manner to cover the third layer. As shown in FIG. 14 and FIG. 15, the interlayer dielectric layer 85 is processed by CMP for planarization. A plurality of through holes 83 are formed in the interlayer dielectric layer 85, which expose the BL contact pad layers 45a and the like. Plugs 81 are embedded in the through holes 83. They are shown in a plan view in FIG. 13. As shown in FIG. 13, the plugs 81 are connected to the BL contact pad layers 45a and 45b, the $V_{SS}$ contact pad layer 47 and $V_{DD}$ contact pad layer 49. The plugs 81 have patterns shown in plan view of FIG. 9. Tungsten, for example, can be used as a material for the plugs 81. The diameter of the through hole 83 at its upper end section is, for example, 0.36 μm, and at its lower end section is, for example, 0.28 μm.

{Fourth Layer}

The fourth layer is structurally located above the structure shown in FIG. 13. As shown in FIG. 10, a plurality of bit lines 51, a plurality of bit lines 53, a plurality of $V_{SS}$ wirings 55 and the $V_{DD}$ wirings 57 are disposed in the fourth layer. The $V_{SS}$ wiring 55 is located between the bit line 51 and the bit line 53, as viewed in the direction of the X-axis direction, and disposed in a center of the memory cell. Each one of the $V_{DD}$ wirings 57 is disposed for, for example, every thirty-two (32) memory cells arranged in the X-axis direction. They linearly extend in the Y-axis direction in FIG. 10. They are connected to the plugs 81 shown in FIG. 13, respectively. The connected sections are shown in FIG. 10 as contact sections 81m. The bit lines 51 has a structure in which, for example, from the bottom layer, a titanium nitride layer, an aluminum-copper alloy layer, and a titanium nitride layer are successively stacked in layers.

FIG. 14 is a cross-sectional view of the fourth layer shown in FIG. 10 taken along plane B1–B2. The bit line 53 appears in the cross-sectional view. A signal that is complementary to the signal flown through the bit line 51 flows through the bit line 53.

The above is a detailed structure of the embodiment of the present invention. It is noted that the patterns shown in FIGS. 1 through 13 are designed patterns. These patterns have corner sections. However, in patterns that are actually formed on a semiconductor substrate, lines that define the corner sections are curved due to the light proximity effect.

[Advantages of the Present Embodiment]

Advantages of the present embodiment are described below.

{1} In accordance with the present embodiment, the size of an SRAM can be reduced because of the following reasons. In accordance with the present embodiment, data is stored by the flip-flops of the memory cells. A flip-flop is formed by connecting an input terminal (a gate electrode) of one inverter to an output terminal (a drain) of the other inverter, and connecting an input terminal (a gate electrode) of the other inverter to an output terminal (a drain) of the one inverter. In other words, a flip-flop cross-couples a first inverter and a second inverter. Therefore, when a flip-flop is formed with two layers, for example, drain-drain connection layers that connect drains of inverters, and drain-gate connection layers that connect gates of the inverters to the drains of the inverters may be formed in one conduction layer to allow cross-couple connections.

However, in the structure described above, the conduction layer is formed extending across a region where the drains of one inverter are located, a region where the gates of the other inverter are located and a region that connect these regions. The conduction layer may present a pattern having three end sections (for example, a pattern having branch sections such as a T-letter shape or an h-letter shape) or spiral patterns with their arm sections intertwined. For example, patterns having a T-letter shape are described in FIG. 1 of Japanese Patent Application Laid-Open No. 10-41409. Patterns having an h-letter shape are described, for example, in FIG. 4(b) on page 203 of IEDM Tech. Digest (1998) by Ishida, et al. Patterns having a spiral shape are described in FIG. 3(b) on page 203 of IEDM Tech. Digest (1998) by Ishida, et al. Such complicated patterns are difficult to accurately reproduce required shapes in the photo-etching process as the patterns are miniaturized, and cannot provide the required patterns and therefore become a hindrance to an attempt to reduce the memory cell size.

In accordance with the present embodiment, as shown in FIG. 1, gate electrode layers (21a and 21b) that define gates of CMOS inverters, drain-drain connection layers (31a and 31b) that connect drains of the CMOS inverters, and drain-gate connection layers (41a and 41b) that connect gates of one of the CMOS inverters and the drains of the other of the CMOS inverters are formed in different layers, respectively. Therefore, three layers are used to form a flip-flop. As a result, patterns in each layer can be simplified (for example, into linear shapes) compared to the case in which two layers are used to form a flip-flop. In this manner, in accordance with the present invention, since patterns in each layer can be simplified, for example, a miniaturized SRAM having a memory cell size of 4.5 $\mu m^2$ can be manufactured in the 0.18 μm process generation.

{2} In accordance with the present embodiment, the parasitic resistance of the source section of the driver transistors can be reduced, and the pattern of the source regions can be simplified for the reasons described below. First, the terms (the gate electrode interlayer region, n⁺ type source region 11a1 and source contact layer 61a that are to be used in describing the reasons are described, and then the reasons are described.

Referring to FIG. 11, the terms are described. A "gate electrode interlayer region" is a region between the gate electrode layer 21a and the gate electrode layer 21b. In other words, it is a region defined by the gate electrode layer 21a, a line 87 connecting the end section 21a1 of the gate electrode layer 21a and the end section 21b1 of the gate electrode layer 21b, the gate electrode layer 21b, and a line (not shown) connecting the end section 21b2 of the gate electrode layer 21b and the end section 21a2 of the gate electrode layer 21a. The n⁺ type source region 11a1 is a region, among the n⁺ type source/drain region 11a, that becomes sources of the driver transistors $Q_3$ and $Q_4$. The source contact layer 61a is the plug 61 located in the source region 11a1.

Next, referring to FIG. 11, the reasons are described. The following description is provided assuming that the drain-gate connection layers 41a and 41b (FIG. 13) are provided in the same second layer where the drain-drain connection layers 31a and 31b are located. In such a structure, the source contact layer 61a of the driver transistors $Q_3$ and $Q_4$ cannot be contained in an area over the gate electrode interlayer region. This is because the source contact layer 61a would contact the drain-gate connection layers 41b. Therefore, there is required, to avoid this problem, a structure in which at least one portion of the source contact layer 61a is protruded from the gate electrode interlayer region (in other words, a structure in which at least one portion of the source contact layer 61a passes over the line 87). This leads to many problems. For example, the pattern of the source region 11a1 becomes complicated (for example, in a convex pattern that protrudes into the side of the word line 23); and the source parasitic resistance increases as a result of the structure in which the source contact layer 61a is separated from the channel of the driver transistors $Q_3$ and $Q_4$.

In accordance with the present embodiment, the drain-gate connection layer 41b (FIG. 13) is located in a layer above the drain-drain connection layers 31a and 31b. As a result, the source contact layer 61a can be contained in an area over the gate electrode interlayer region while avoiding contact between the drain-gate connection layer 41b and the source contact layer 61a. Accordingly, in accordance with the present embodiment, the source resistance of the driver transistors $Q_3$ and $Q_4$ can be reduced and the pattern of the source region 11a1 can be simplified (for example, into a rectangular pattern having a generally uniform width). As a result, in accordance with the present embodiment, process margins, in particular, photo-process margins, in the manufacturing step for manufacturing semiconductor memory devices, can be expanded, such that the measurement precision in the channel width of driver transistors $Q_3$ and $Q_4$ can be improved. Accordingly, in accordance with the present embodiment, the operation of memory cells can be stabilized.

{3} In accordance with the present embodiment, the resistance of the auxiliary word lines 23 can be lowered, and the salicide narrow line effect of the auxiliary word lines 23 can be prevented. Referring to FIG. 11, the reason for this is described. In a structure in which at least one portion of the source contact layer 61a extends out of the gate electrode interlayer region, as described above, a part of the auxiliary word line 23a must be bent toward the auxiliary word line 23b to avoid contact between the auxiliary word line 23a and the source contact layer 61a. In accordance with the present embodiment, since the source contact layer 61a can be contained in an area above the gate electrode interlayer region, the size of the memory cells can be reduced, and also the auxiliary word lines 23 can be formed in linear patterns.

In this manner, in accordance with the present embodiment, the patterns of the auxiliary word lines 23 are linear, such that the line length can be shortened compared to auxiliary word lines having partially bent patterns. Therefore, in accordance with the present embodiment, the resistance of the auxiliary word lines 23 can be lowered. Also, when a word line is in a partially curved pattern, the curved portion may become narrower, which results in a localized increase in the gate wiring resistance caused by narrow line effect in a salicide process. In accordance with the present embodiment, the patterns of the auxiliary word lines 23 are linear, and do not have curved portions. As a result, the narrow line effect, which may be caused by the curved portions, does not occur, and an increase in the resistance of the auxiliary word lines 23 that may be caused by the narrow line effect can be prevented. It is noted that, in the present embodiment, the word lines have a structure in which auxiliary word lines and main word lines are separately provided. However, word lines may be provided in one-layer structure without being divided (in other words, the word lines are formed only by the auxiliary word lines 23).

{4} In accordance with the present embodiment, not only the size of memory cells, but also the size of the entire semiconductor memory device can be reduced because of the following reasons. If auxiliary word lines are formed from patterns having curved portions, an extra area in reserve for forming a well contact region cannot be formed in an area between the auxiliary word lines. Accordingly, a space must be provided for an every specified number of memory cells, and a well contact region and wiring for fixing a well potential must be formed in the space. However, such a space is a dead space in which memory cells are not formed, and therefore a semiconductor memory device becomes larger by that space.

In accordance with the present embodiment, as shown in FIG. 11, the auxiliary word lines 23 are in linear patterns. As a result, the $p^+$ type well contact region 17a can be located between the auxiliary word line 23a and the auxiliary word line 23b. Furthermore, the $p^+$ type well contact region 17a is connected to the Vss wiring 55 through the $V_{SS}$ local wiring 37 (FIG. 5) and the $V_{SS}$ contact pad layer 47 (FIG. 8) to thereby be fixed at the grounding potential. As a result, in accordance with the present embodiment, a grounding wiring exclusively used for p-type well contacts is not required, and therefore the semiconductor memory device can be reduced in size.

{5} In accordance with the present embodiment, latch-up can be prevented. The reasons are described above.

What is claimed is:

1. A semiconductor memory device, comprising:

a memory cell including a first driver transistor of a first conduction type, a second driver transistor of the first conduction type, a first load transistor of a second conduction type, a second load transistor of the second conduction type, a first transfer transistor of the first conduction type and a second transfer transistor of the first conduction type;

a well contact region of the first conduction type; and a well contact region of the second conduction type, wherein the memory cell, the well contact region of the first conduction type, and the well contact region of the second conduction type are provided in a plurality, respectively, the memory cell is equipped with first and second gate electrode layers, first and second drain-drain connection layers, and first and second drain-gate connection layers, the first gate electrode layer includes gate electrodes of the first driver transistor and the first load transistor, the second gate electrode layer includes gate electrodes of the second driver transistor and the second load transistor, the first drain-drain connection layer connects a drain region of the first driver transistor and a drain region of the first load transistor, the second drain-drain connection layer connects a drain region of the second driver transistor and a drain region of the second load transistor, the first drain-gate connection layer connects the first drain-drain connection layer and the second gate electrode layer, the second drain-gate connection layer connects the second drain-drain connection layer and the first gate electrode layer, the drain-gate connection layers, the drain-drain connection layers, and the gate electrode layers are provided in different layers, respectively, in plan view, the first and second gate electrode layers are located between the first drain-drain connection layer and the second drain-drain connection layer, the well contact region of the first conduction type is provided for each specified number of memory cells arranged in a first direction, and the well contact region of the second conduction type is provided for every two of memory cells arranged in a second direction, which is perpendicular to the first direction.

2. The semiconductor memory device according to claim 1, further comprising a plurality of word lines extending in the first direction, wherein the word lines include gate electrodes of the first and second transfer transistors, and word line intermediate regions where the first and second gate electrode layers are positioned and word line intermediate regions where the well contact regions of the second conduction type are alternately arranged.

3. The semiconductor memory device according to claim 2, wherein the word lines are in linear patterns.

4. The semiconductor memory device according to claim 2, further comprising a plurality of source contact layers, wherein, in each of the memory cells, the first and second drain-gate connection layers are located in a layer above the first and second gate electrode layers, source regions of the first and second driver transistors are located in a gate electrode interlayer region that is a region between the first gate electrode layer and the second gate electrode layer, and each of the source contact layers is contained in an area above each of the gate electrode interlayer regions.

5. The semiconductor memory device according to claim 1, wherein regions where the first and second load transistors are to be formed are positioned at both sides in the first direction of the well contact region of the first conduction type.

6. The semiconductor memory device according to claim 1, wherein the first conduction type is an n-type, the second conduction type is an p-type, and further comprising first, second, third and fourth conduction layers, wherein the first gate electrode layer, the second gate electrode layer and an auxiliary word line are located in the first conduction layer, the first drain-drain connection layer, the second drain-drain connection layer, a power supply line, a first contact pad layer, a second contact pad layer and a third contact pad layer are located in the second conduction layer, the first drain-gate connection layer, the second drain-gate connection layer, a main word line, a fourth contact pad layer, a fifth contact pad layer and a sixth contact pad layer are located in the third conduction layer, a first bit line, a second bit line and a grounding line are located in the fourth conduction layer, the auxiliary word line extends in the first direction, the power supply line connects to a source region of the first load transistor, a source region of the second load transistor and the well contact region of the first conduction type, the first contact pad layer is used to connect the first bit line and a source/drain region of the first transfer transistor, the second contact pad layer is used to connect the second bit line and a source/drain region of the second transfer transistor, the third contact pad layer is used to connect the well contact region of the second conduction type, a source region of the first driver transistor and a source region of the second driver transistor to the grounding line, the main word line extends in the first direction, the fourth contact pad layer is used to connect the first bit line and the source/drain region of the first transfer transistor, the fifth contact pad layer is used to connect the second bit line and the source/drain region of the second transfer transistor, the sixth contact pad layer is used to connect the well contact region of the second conduction type, the source region of the first driver transistor and the source region of the second driver transistor to the grounding line, and the first and second bit lines extend in the second direction which is perpendicular to the first direction.

7. The semiconductor memory device according to claim 1, wherein the first gate electrode layer, the second gate electrode layer, the first drain-drain connection layer and the second drain-drain connection layer are in linear patterns, and are disposed in parallel with one another.

8. The semiconductor memory device according to claim 1, wherein the memory cell has a size of 4.5 $\mu m^2$ or less.

* * * * *